(12) United States Patent
Lettvin

(10) Patent No.: US 7,952,626 B2
(45) Date of Patent: May 31, 2011

(54) GEOMETRIC REMAPPING WITH DELAY LINES

(76) Inventor: Jonathan D. Lettvin, Watertown, MA (US)

( * ) Notice: Subject to any disclaimer, the term of this patent is extended or adjusted under 35 U.S.C. 154(b) by 1918 days.

(21) Appl. No.: 10/990,784

(22) Filed: Nov. 17, 2004

(65) Prior Publication Data
US 2005/0104632 A1 May 19, 2005

Related U.S. Application Data

(60) Provisional application No. 60/520,928, filed on Nov. 17, 2003.

(51) Int. Cl.
*H04N 3/14* (2006.01)
*G02B 6/26* (2006.01)

(52) U.S. Cl. ........ 348/294; 348/295; 348/332; 348/352; 348/154; 327/100; 385/24

(58) Field of Classification Search .................. 348/295, 348/294, 332, 352, 154, 441; 327/100, 13; 716/6, 12; 385/24, 39, 15
See application file for complete search history.

(56) References Cited

U.S. PATENT DOCUMENTS

| | | | |
|---|---|---|---|
| 3,492,497 A | 1/1970 | Gilmour et al. | 307/229 |
| 3,574,443 A | 4/1971 | Nanba | 356/215 |
| 3,781,119 A | 12/1973 | Mori | 356/222 |
| 3,829,865 A | 8/1974 | Kamasako | 354/24 |
| 3,902,812 A | 9/1975 | Honkawa | 356/188 |
| 4,243,318 A | 1/1981 | Stohr | 356/39 |
| 4,473,836 A | 9/1984 | Chamberlain | 357/30 |
| 4,584,606 A | 4/1986 | Nagasaki | 358/209 |
| 4,598,414 A | 7/1986 | Dries et al. | 377/58 |
| 4,742,238 A | 5/1988 | Sato | 250/578 |
| 4,806,791 A | 2/1989 | Mizuide | 307/355 |
| 4,973,833 A | 11/1990 | Takada et al. | 250/208.1 |
| 4,983,841 A | 1/1991 | Stewart et al. | 250/358.1 |
| 5,500,615 A | 3/1996 | Barter | 327/111 |
| 5,812,008 A | 9/1998 | Nigel | 327/350 |
| 6,546,158 B2 * | 4/2003 | Fondeur et al. | 385/3 |
| 7,231,017 B2 | 6/2007 | Gertsenshteyn et al. | 378/87 |
| 7,362,432 B2 | 4/2008 | Roth | 356/317 |
| 7,796,173 B2 * | 9/2010 | Lettvin | 348/294 |
| 2002/0054726 A1 | 5/2002 | Fondeur et al. | 385/15 |

(Continued)

OTHER PUBLICATIONS

*The International Preliminary Report on Patentability*, International Application No. PCT/US2004/038505, Mar. 10, 2009, 7 pages.

(Continued)

*Primary Examiner* — Jefferey Harold
*Assistant Examiner* — Jean W Désir
(74) *Attorney, Agent, or Firm* — Sunstein Kann Murphy & Timbers LLP

(57) ABSTRACT

A signal processing system distributes an input signal over a plurality of shaped signal distribution structures that are interconnected with a plurality of shaped signal pickup units. The signal distribution structures and/or the signal pickup units include delay lines. The shape of the signal distribution structures and the shape of the signal pickup units and the configuration of the interconnections between the shaped structures and the pickup units determine the type of analysis performed on the signals. The signal possessing is distributed across the shaped structures. Input information is diffracted or spread, such that statistical correlations can be found by reconverging the diffracted information. Signals propagated through the system can be a combination of analog, digital and pulse signals. Optionally, feedback is used to amplify or attenuate earlier stages, such that outputs or actions are based on the relative importance of the input signals.

14 Claims, 38 Drawing Sheets

U.S. PATENT DOCUMENTS

| | | | |
|---|---|---|---|
| 2002/0106151 A1 | 8/2002 | Ranalli | 385/27 |
| 2003/0036700 A1 | 2/2003 | Weinberg | 600/436 |
| 2003/0135836 A1 | 7/2003 | Chang et al. | 716/11 |
| 2008/0300490 A1* | 12/2008 | Chiang et al. | 600/459 |

OTHER PUBLICATIONS

The International Search Report and the Written Opinion of the International Searching Authority, International Application No. PCT/US04/26406, International Searching Authority, Aug. 5, 2008, 13 pages.

*The International Search Report and the Written Opinion of the International Searching Authority*, International Application No. PCT/US04/38505, International Searching Authority, Aug. 5, 2008, 10 pages.

\* cited by examiner

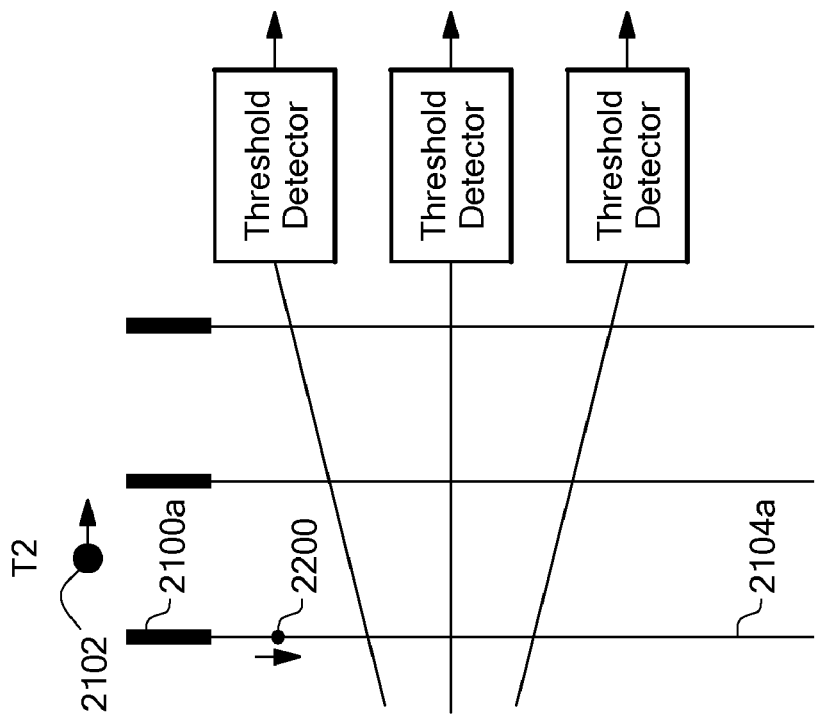
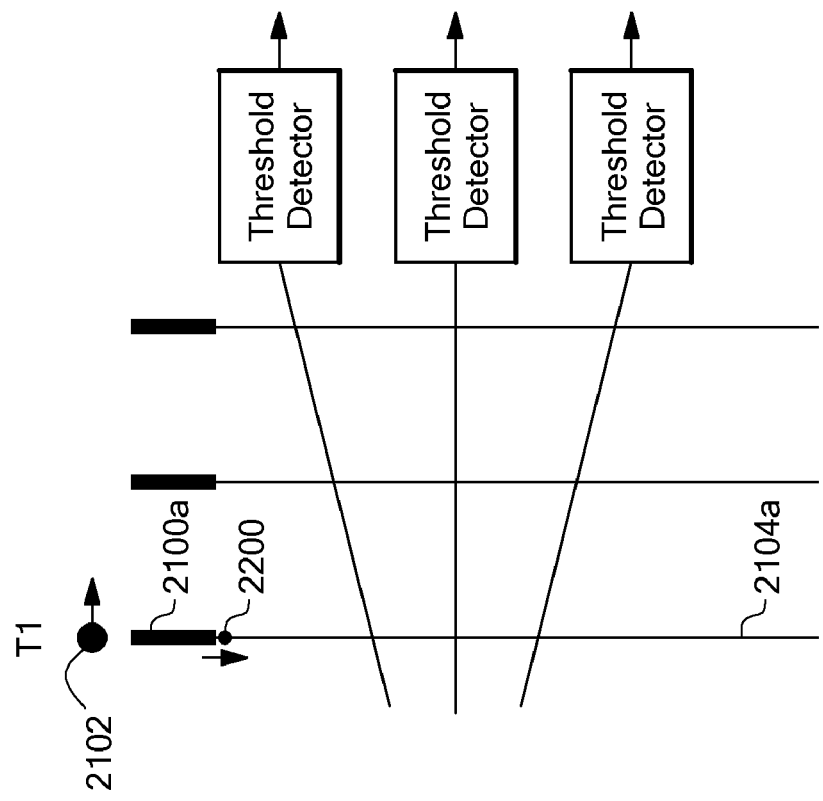
FIG. 22b
FIG. 22a

GEOMETRIC REMAPPING WITH DELAY LINES

CROSS REFERENCE TO RELATED APPLICATIONS

This application claims the benefit of U.S. Provisional Application No. 60/520,928 titled "Generalized Coincidence Detection Method," filed Nov. 17, 2003.

STATEMENT REGARDING FEDERALLY SPONSORED RESEARCH OR DEVELOPMENT (Not applicable)

BACKGROUND OF THE INVENTION

The present invention relates to signal processing and, more particularly, to shaped signal distribution structures and shaped signal pickup structures used to process signals.

Traditional signal processing circuits and pattern recognition software and hardware are used to extract information from sensory data. However, such systems have only rudimentary information extraction capabilities. For example, systems that can identify moving points are quite complex. Furthermore, systems that can render an image or locate information in sensory data with more resolution than the granularity of the sensor array used to produce the data have unnecessary limits.

BRIEF SUMMARY OF THE INVENTION

The present invention provides methods and apparatus for processing signals from sensors or other systems. This signal processing involves acquiring signals from external events or another system and analyzing the input signals to detect features or extract desired content from the input signals or to motivate subsequent systems, if a predetermined condition is detected. For example, in one embodiment, a signal processor inputs a pixelated image and identifies points in the image with greater resolution than is directly available in the original pixelated image. In another example, if the set of input signals represents a visual image of a point at a certain coordinate in the field of view or moving at a certain speed, an output signal is generated. In another embodiment, a signal processor activates a mechanism to detect a moving object and to orient a sensor array to aim the array, such that the object's image is centered on the sensor array.

An input signal is distributed over a plurality of shaped signal distribution structures. These structures are interconnected with a plurality of shaped signal pickup units. The shape of the signal distribution structures and the configuration of the interconnections between the shaped structures and the pickup units determine the type of analysis performed on the input signals. The signal distribution structures and the signal pickup units are shaped, and the interconnections between the signal distribution structures and the pickup units are configured, such that a combination of the signal distribution structures and the pickup units generates a signal if the set of input signals contains certain information. The signal possessing is distributed across the shaped structures. Signals propagated through embodiments of the disclosed system can be a combination of analog, digital and pulse signals.

Input information is diffracted or spread, such that statistical correlations can be found by reconverging the diffracted information. Optionally, feedback is used to amplify or attenuate earlier stages, such that outputs or actions are based on the relative importance of the input signals.

BRIEF DESCRIPTION OF THE SEVERAL VIEWS OF THE DRAWINGS

These and other features, advantages, aspects and embodiments of the present invention will become more apparent to those skilled in the art from the following detailed description of an embodiment of the present invention when taken with reference to the accompanying drawings, in which:

FIGS. 22a-h are a series of time-sequenced frames depicting operation of the moving-object detector of FIG. 21;

DETAILED DESCRIPTION OF THE INVENTION

The contents of U.S. Provisional Application No. 60/520,928, filed Nov. 17, 2003, titled "Generalized Coincidence Detection Method," and U.S. patent application Ser. No. 10/918,151, filed Aug. 13, 2004, titled "Imaging System," are hereby incorporated by reference herein.

The present invention provides methods and apparatus for processing signals, such as signals from external sensors. Systems for processing signals according to the present disclosure can include several subsystems. Some of the subsystems are optional. In general, the signal processing involves acquiring signals from external events or another system and analyzing the signals to extract desired content or to motivate subsequent systems if a predetermined condition is detected. In one example, a signal processor inputs a pixelated image and identifies points in the image with greater resolution than is directly available in the pixelated image. In another example, a signal processor activates a mechanism to detect a moving object and orient a sensor array to aim the array, such that the object's image is centered on the sensor array.

Figure 1:
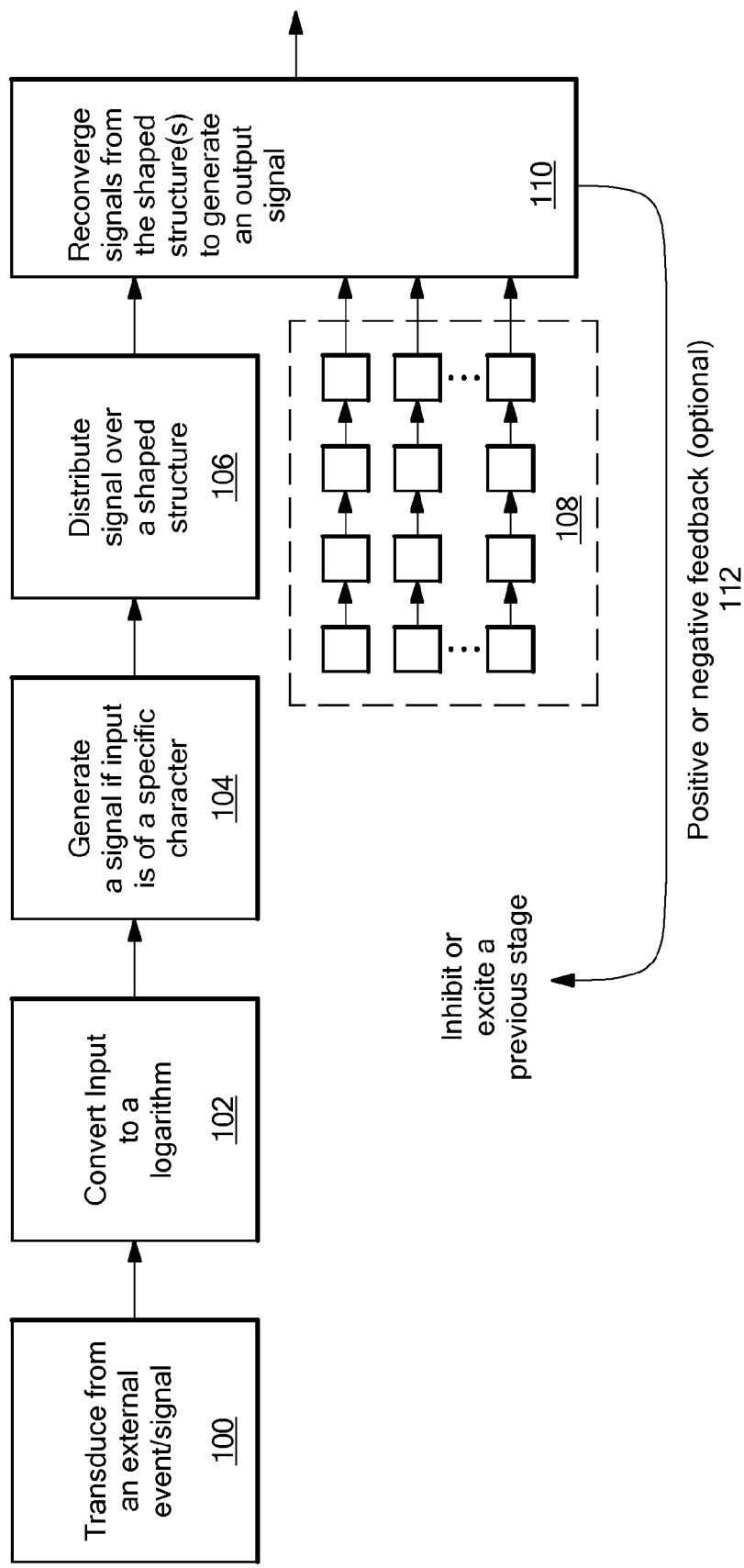
FIG. 1 is a high-level abstraction of operations performed by one embodiment of the disclosed system.

FIG. 1 shows a high-level abstraction of operations performed by one arrangement of subsystems, according to the disclosed system. External events or signals are transduced at 100 to provide an input into a general signal processing system. For example, signals from optical or acoustic sensors can be transduced. To enable the signal processing system to handle a wide dynamic range of inputs, the transduced signals are converted to logarithms thereof at 102. At 104, the converted signals are examined for a specific characteristic. For example, the converted signals can be analyzed for the occurrence of a change in the signal over time, such as to detect an edge of an object coming into or out of view of an optical sensor. The operations 100-104 can be considered pre-processing.

At 104, if the specific character is detected, a signal is distributed over a shaped signal distribution structure at 106. Similarly, other input signals are pre-processed and distributed over similar shaped signal distribution structures, as indicated by dashed box 108. The shaped signal distribution structures are interconnected with a plurality of signal pickup units, as described in more detail below. The signal distribution structures are shaped, and the interconnections between the signal distribution structures and the pickup units are configured, such that a combination of the signal distribution structures and the pickup units generates a signal 110 if the set of transduced inputs contains certain information. For example, a signal can be generated if the set of transduced inputs represents a visual image of a point at a certain coordinate. The shape of the signal distribution structures and the configuration of the interconnections between the shaped structures and the pickup units determine the type of analysis performed on the transduced signals. Generating a signal with the pickup units, i.e. when a sought-after piece of information is detected in the signals distributed over the shaped distribution structure, is referred to herein as "reconvergence."

Optionally, a positive or negative feedback signal 112 can be generated by the reconvergence circuit to attenuate and/or amplify a previous stage. For example, if the reconvergence circuit detects a sought-after object in a visual field of view, a positive feedback signal can increase the sensitivity of one or more previous stages to this object or to similar objects, thereby, in a sense, increasing the system's awareness of, and attention to, the object. Alternatively, now that the object has been detected and an output signal has been generated, a negative feedback signal can decrease the sensitivity of one or more of the previous stages to this object, thereby allowing the system to ignore the object and, instead, utilize the system's resources to detect other objects.

Each of the subsystems of FIG. 1 will now be described.

Sensor Complex

Figure 2:
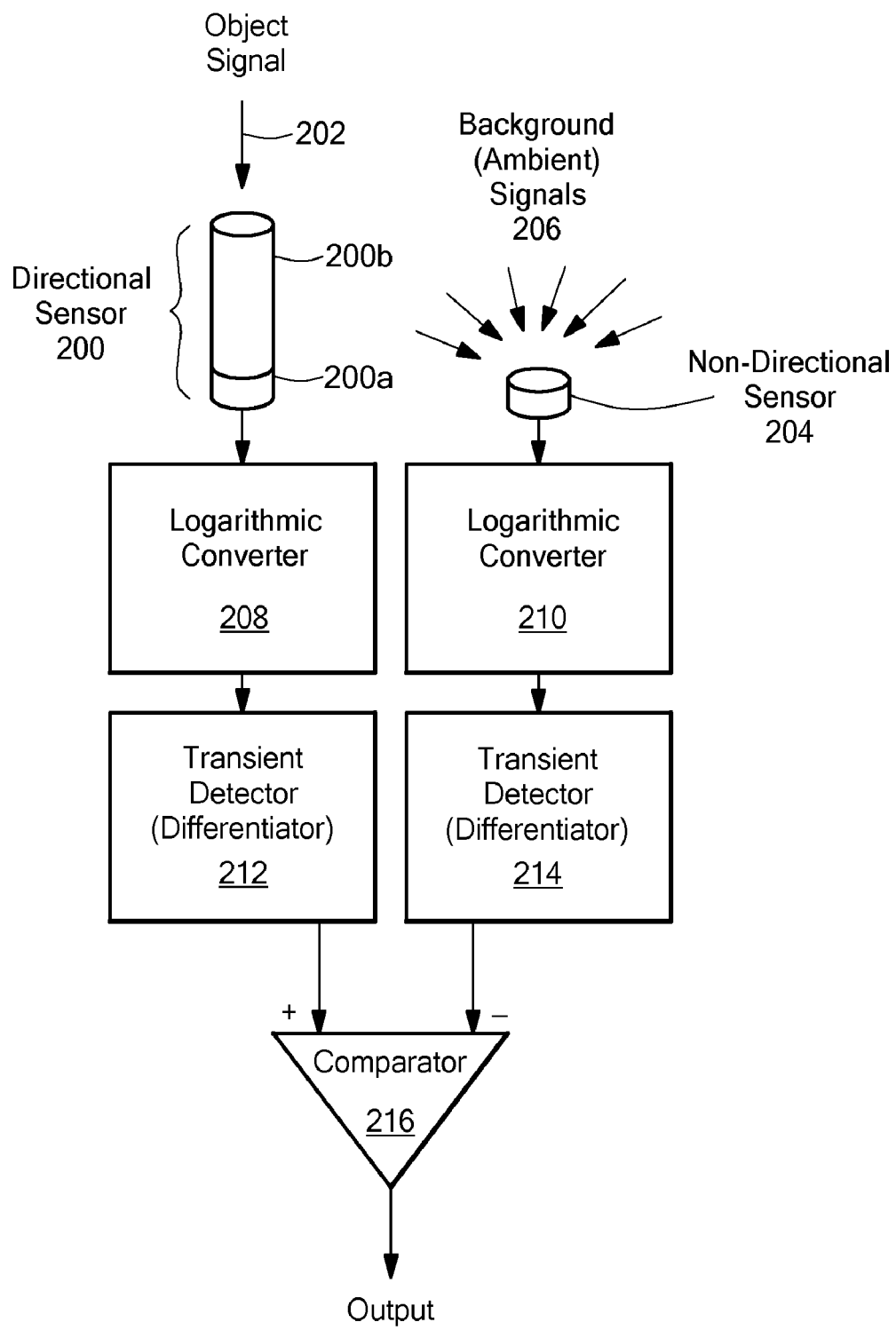
FIG. 2 is a block diagram of the sensor complex of a FIG. 1.

FIG. 2 illustrates an exemplary embodiment of signal transduction, logarithmic conversion and selective signal generation, i.e. operations performed at 100-104 in FIG. 1. To handle a wide dynamic range of flux impinging on sensors, sensor signals can be converted to signals representing logarithms thereof. To reduce the amount of processing performed on the output signals from the sensors, only changes in the flux impinging on the sensors need to be processed. Furthermore, each sensor's output signal can be compared to a background (ambient) signal, and common mode characteristics of the sensor's signal can be discarded. FIG. 2 is a block diagram of one embodiment of a sensor complex that performs such functions. A directional sensor 200 is oriented to receive signals 202 along an axis, i.e. from a particular direction in the field of view. Many points (at different distances) in the field of view can lie along the axis of a single sensor.

The directional sensor 200 is shown as a collimated sensor, however other configurations of directional sensors are acceptable, as long as the reception angles of the sensors are sufficiently small. In one embodiment, the collimated sensor 200 includes an infrared-sensitive photodiode 200a and a tube 200b. The inside surface of the tube 200b is constructed or treated to reduce reflections, such as by painting the inside surface of the tube flat black. The length-to-diameter ratio of the tube 200b can be selected to achieve a desired reception angle of the directional sensor 200. Non-directional sensors are also acceptable.

The sensor complex detects changes in flux along the axis of the directional sensor 200. These changes in flux can be caused by movement of contrasty (relative to the background) points of an object into or out of the reception angle of the directional sensor 200. For example, as points along edges of the object (as viewed against a contrasting background) move into or out of the reception angle of the directional sensor 200, the sensor complex detects these edge points. Similarly, the sensor complex can detect boundaries between two contrasting portions of the object, as points along these boundaries move into or out of the reception angle of the directional sensor 200. The sensor complex can also detect points on a stationary object that change contrast over time, such as because the points blink or because of a change in the amount of radiation illuminating the object, e.g. if the points are more reflective than the rest of the object.

As noted, the sensor complex detects differences between signals detected by the directional sensor 200 and a background (ambient) signal. A non-directional sensor 204 detects background flux 206. Alternatively, the background flux 206 can be ascertained by averaging signals from a plurality of directional sensors. If a plurality of directional sensors is used to ascertain the background flux, the sensors may be oriented in diverse directions.

Output signals from the directional sensor 200 and the non-directional sensor 204 are fed to respective logarithmic converters 208 and 210. Converting signals representing the flux impinging on the sensors 200 and 204 into signals representing logarithms thereof enables the sensor complex to operate over a wide dynamic range of flux impinging on the sensors, without requiring automatic gain control (AGC), time to adapt to changes in the background flux or time to recover from overloads. For example, sensor signals that span a 12-decade range of flux can be processed by subsequent circuits.

The outputs of the logarithmic converters 208 and 210 are fed to respective transient detectors (differentiators) 212 and 214. As noted above, only changes in the flux need to be processed. The outputs of the transient detectors 212 and 214 are fed to a comparator 216. The output of the comparator 216 represents a difference between transients detected along the axis of the directional sensor 200 and transients in the background flux. In one embodiment, the output of the comparator 216 indicates whether the sensor complex detects an increase or a decrease in contrast. Alternatively, the output of the comparator 216 simply indicates that the sensor complex detects a change in contrast, without indicating whether the contrast increased or decreased. In yet other embodiments, the signal detected by the directional sensor 200 is also fed to a subsequent circuit, as described below.

Processing transients in sensor signals makes systems insensitive to DC or slowly changing components of the signals. For example, current flowing through a photodiode slowly heats the photodiode and changes its response characteristics. This effect is commonly called "drift." However, systems according to the present disclosure are insensitive to this drift, because these systems process transients, not steady-state information, in sensor signals. Comparing changes in flux impinging on the directional sensor 200 with changes in background flux makes systems according to the present disclosure insensitive to changes in illumination on an object (assuming a uniformly reflective object). Furthermore, the ratio of the logarithms of the amount of illumination reflected from two contrasting portions of an object remains constant, even if the amount of illumination impinging on the object varies. In general, "contrast" herein means a ratio of logarithms. Although all three forms of signal processing (logarithmic conversion, transient detection and comparison) provide advantages, systems according to the present disclosure can use any combination of these signal processing techniques.

Appropriate exemplary circuits for the logarithmic converters 208 and 210, the transient detectors 212 and 214 and the comparator 216 are described in co-pending U.S. patent application Ser. No. 10/918,151, filed Aug. 13, 2004, titled "Imaging System." However, other circuits that perform the above-described functions are acceptable, regardless of whether the circuits are implemented using electronic, photonic, hydraulic, molecular or other technologies. Furthermore, these functions can be implemented in hardware, software, firmware or combinations thereof.

As noted, the transients detected by the sensor complex represent contrasty points on objects, as the points move into or out of the reception angle of the directional sensor 200, or as stationary points within the reception angle change contrast. The contrasty points on the objects often correspond to points along the periphery or other edges of the objects. Detecting and displaying a plurality of these periphery or edge points, such as by a three-dimensional display device, can enable a user to identify the objects. To facilitate such detection and display, outputs of a plurality of sensor complexes (also referred to herein as "sensors") are distributed over a plurality of shaped structures to facilitate reconvergence.

Reconvergence

Figure 3:
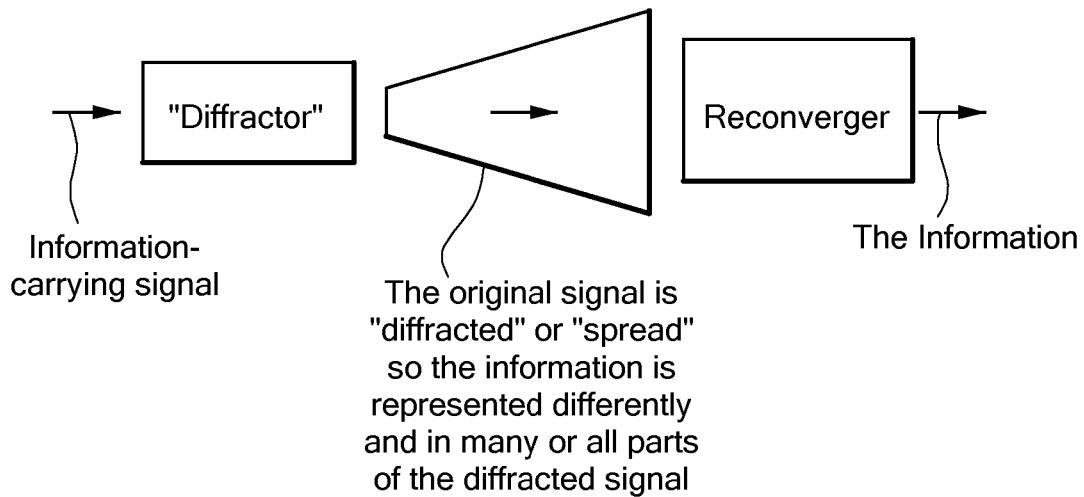
FIG. 3 is a conceptual schematic diagram of diffraction and reconvergence, according to one embodiment of the disclosed system.

Input signals, such as signals from a sensor array, carry information, such as information about a visual scene within a field of view of the sensor array. Embodiments of the presently disclosed system "diffract" or spread these input signals, so the information is represented differently and in many or all parts of the diffracted signals, as conceptually depicted in FIG. 3. ("Diffraction" as used herein is not limited to optical diffraction.) For example, in a hologram, all scene information is stored in all parts of the hologram, therefore the entire scene can be reproduced from a small portion of the hologram, albeit possibly with the introduction of noise. In the hologram, scene information is stored redundantly throughout the hologram as an interference pattern. The interference pattern is different than, but derived from, visual information received directly from the original scene. Such an interference pattern is an example of a diffracted signal, as that term is used herein.

Embodiments of the presently disclosed system take advantage of redundant information in a diffracted signal from, for example, a sensor array. The redundancy need not be located throughout the diffracted signal, i.e. the redundant information can be located in only portions of the diffracted signal. Because a diffracted signal typically occupies more area, volume, spectrum or data bits, etc. than the original signal, reconverging information from a diffracted signal can yield more resolution than was apparent in the original signal. This is referred to herein as "hyperacuity." (Reconvergence does not, however, simply reverse the diffraction. Reconvergence uses a different mechanism than was used to create the diffracted signal.) A reconverged signal can, for example, represent an object with more resolution than is directly available from a pixelated sensor array, as illustrated in the following example.

Figure 4:
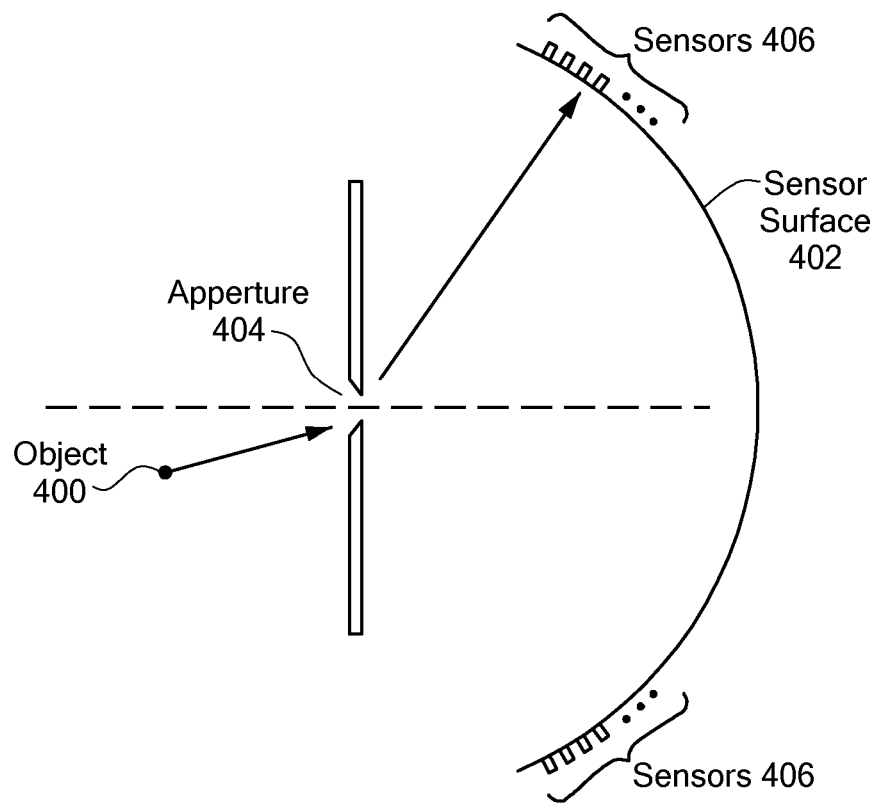
FIG. 4 is a schematic diagram of an optical system that includes an aperture and a sensor surface.
Figure 5:
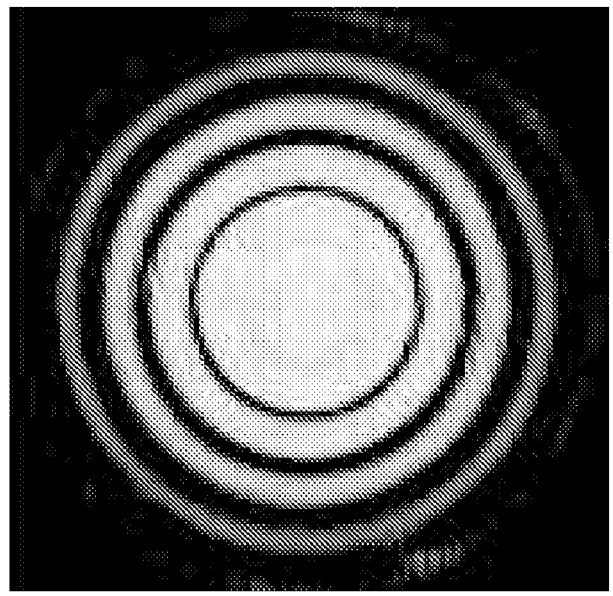
FIG. 5 is a set of an Airy disk and Airy rings projected within the optical system of FIG. 4.

As shown schematically in FIG. 4, if a monochromatic object 400 projects an image onto a surface 402 through a circular aperture 404, each point of the object is projected as an Airy disk and a series of concentric Airy rings surrounding the Airy disk. This well-known phenomenon is caused by optical diffraction of the signal from the object as the signal passes through the circular aperture 404. An example of an Airy disk and Airy rings caused by such a point is shown in FIG. 5. If the surface 402 (FIG. 4) were covered with an array of sensors 406, the sensors would pixelate the image projected on the surface. An example of a pixelated image of an Airy disk and Airy rings is shown in FIG. 6.

Figure 6:
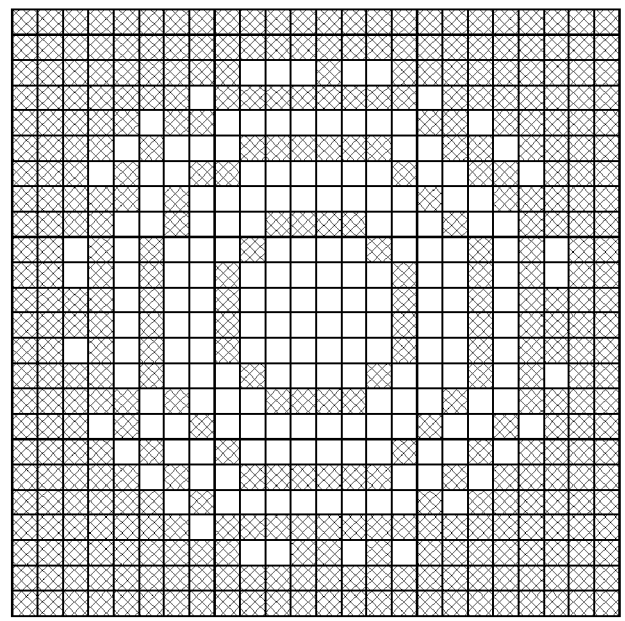
FIG. 6 is a pixelated image of the Airy disk and Airy rings of FIG. 5.
Figure 7:
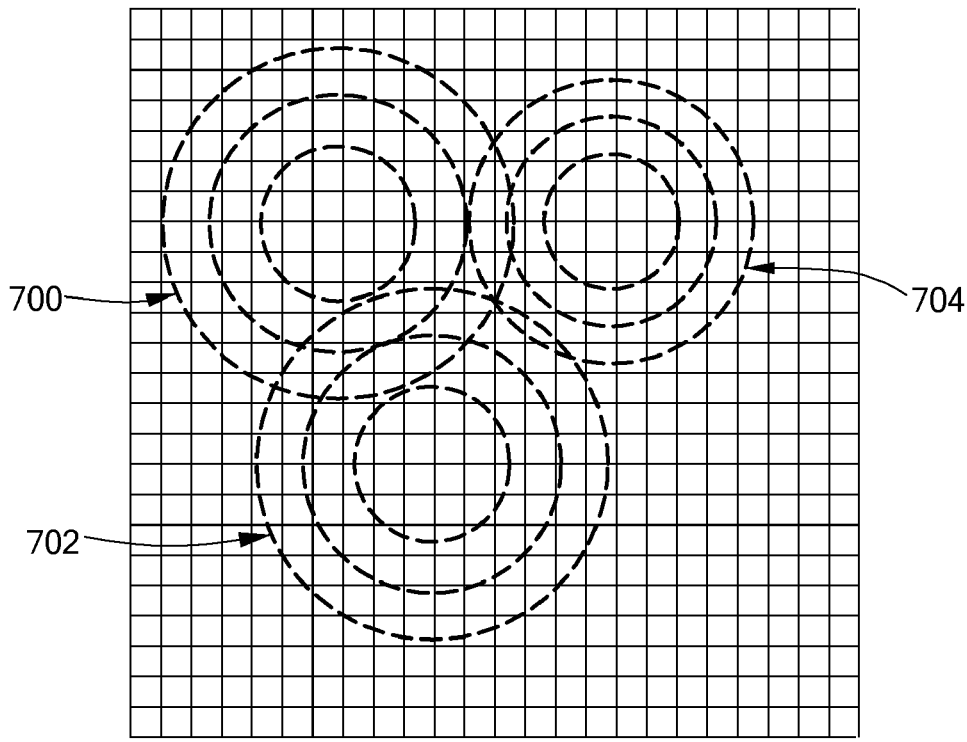
FIG. 7 is a diagram of three sets of Airy rings on a sensor array.

The precise position of the point can be determined from the Airy rings, thus the visual information from the pixelated image of the Airy rings in FIG. 6 can be reconverged to obtain information about the point, even if the Airy disk is larger than one sensor, i.e. one pixel, because the Airy rings cover a plurality of sensors (pixels). In a preferred embodiment, the precise position of the point can be determined from the narrow dark bands between logarithms of the Airy rings, as described in more detail below. Thus, information from this plurality of sensors can be reconverged to obtain information about the point. For example, if three monochromatic points project three sets of Airy rings 700, 702 and 704 on the sensor surface 402, as shown in FIG. 7, a series of coincidence detectors can be used to generate signals corresponding to the three points. (Not all sets of Airy rings are necessarily of equal diameter. Note that one set of Airy rings 704 is smaller than the other sets of Airy rings 707 and 702.)

Figure 8:
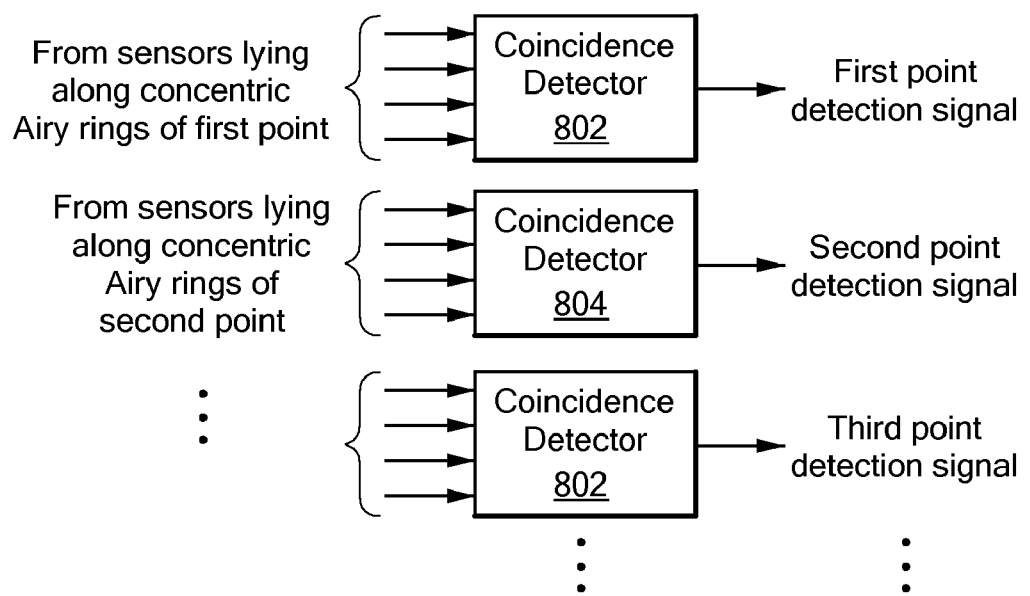
FIG. 8 is a block diagram of an Airy rings detection system.

For example, as illustrated in FIG. 8, a first coincidence detector 802 is connected to sensors 406 lying along the first set of concentric Airy rings 700 that corresponds to the first point. In other words, the subset of all sensors 406 that is expected to be illuminated by portions of the Airy rings 700 is connected to the coincidence detector 802. The coincidence detector 802 can include, for example, combinatorial logic (such as AND and OR gates reduced by use of Karnaugh mapping) to detect if at least a predetermined number of the sensors lying along the concentric Airy rings 700 detect at least a predetermined flux or, preferably, a predetermined flux transient. Similarly, a second coincidence detector 804 is connected to sensors 406 lying along the second set of concentric Airy rings 702 that correspond to the second point, and a third coincidence detector 806 is connected to sensors lying along the third set of concentric Airy rings 704 that correspond to the third point. Other coincidence detectors (not shown) are connected to sensors lying along other sets of concentric Airy rings (not shown). Of course, some of the sensors 406 are connected to more than one coincidence detector, because many possible Airy rings can coincide at a single point on the sensor surface. Furthermore, far off-axis points in the field of view project Airy rings near the edge of the surface 402, and portions of some of these Airy rings may be projected beyond the edge of the surface. Thus, only portions of some Airy rings are projected on the surface 402. The sensors 406 connected to a coincidence detector need not form a complete circle in these cases. The predetermined "threshold" number of sensors 408 required to trigger the coincidence detector is reduced in these cases.

Thus, a reconverged signal can represent a point with more resolution than is directly available from the sensor array. For example, the coincidence detectors 802, 804 and 806 can detect a point, even if the Airy disk projected by the point is larger than a single sensor, because the Airy rings of the point are projected onto a number of sensors. As noted, not all of the sensors of all the rings need to be triggered to trigger the coincidence detector and, therefore, detect the point. Instead, only a statistically significant number of the sensors need to be triggered. Consequently, the system continues to function even if some of the sensors 406 are damaged or fail or the input signal contains noise. In addition, sensor signals from only a small number, such as three, of the Airy rings need to be considered.

Changing the size of the aperture 404 changes the diameter of the Airy rings projected on the sensor surface 402, as is well known. A larger aperture reduces the diameter of Airy rings, so there are more narrow dark bands close to the Airy disk. As ambient light level is reduced, the increased number of narrow dark bands increases the amount of converging data, until the ambient light level is so low that the outer bands become undetectable. At this point, resolution of the point becomes less reliable. However, images can nonetheless be produced. Furthermore, a system with an adjustable aperture can accommodate varying lighting conditions. For example, the aperture can be adjusted in response to the average light level detected by the sensors 406 or in response to the highest light level detected by one or more of the sensors. Such a system can protect the sensors 406 from overload under high-light conditions and can produce images under low-light conditions.

Figure 42:
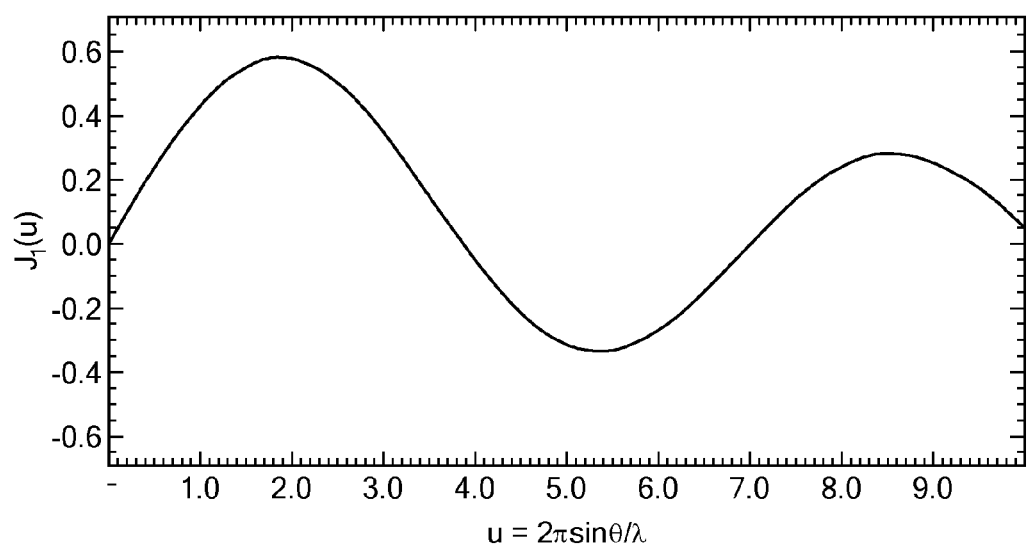
FIG. 42 is a graph of the Bessel function.
Figure 43:
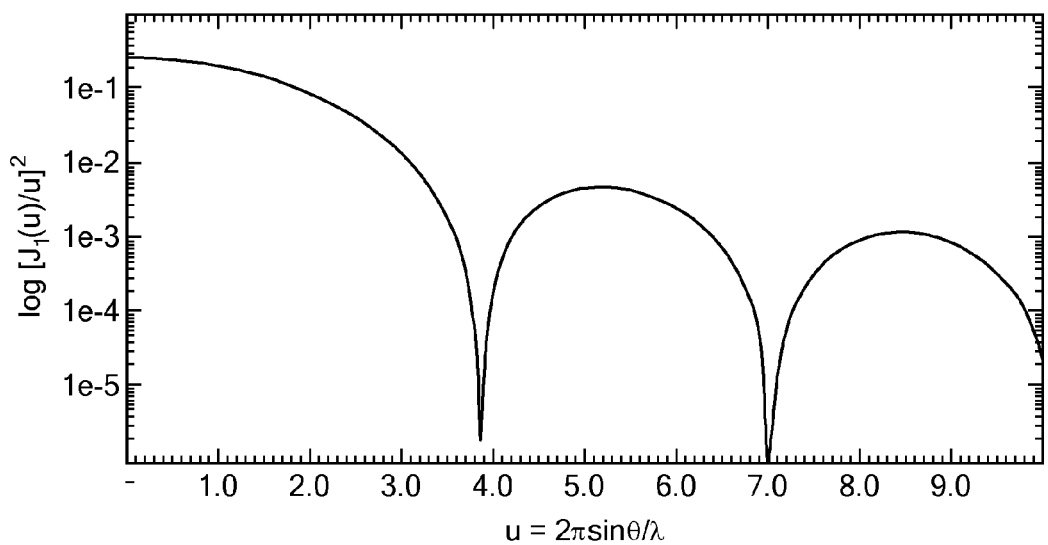
FIG. 43 is a graph of the log of the square of the Bessel function.

Airy rings from a point fall on the sensor surface 402 (FIG. 4) in waves, as described by the Bessel function J1, as shown in FIG. 42. The flux intensity of these rings is the square of J1 at various distances from the center of the Airy disk. Taking the logarithm of the square of J1 emphasizes the dark bands between the Airy rings, as shown in FIG. 43. In particular, taking the logarithm of the square of J1 makes these dark bands narrow and sharply defined, i.e. having sharp edges that are of high contrast with the rings between these dark bands. This is seen as the deep, narrow valleys and a graph of FIG. 43. The sensor complex shown in FIG. 2 includes a logarithmic converter 208 to take the logarithm of the square of J1, with reference to the object signal 202. Similarly, a logarithmic converter 210 picks the logarithm of the square of J1, with reference to the background (ambient) signal 206.

As noted, the coincidence detectors 802-806 can be implemented with combinatorial logic. However, for complex coincidence detection, distributing pre-processed signals over shaped signal distribution structures that are interconnected with signal pickup units can provide advantages. Examples of such arrangements are described next.

Shaped Signal Distribution Trees

Figure 9:
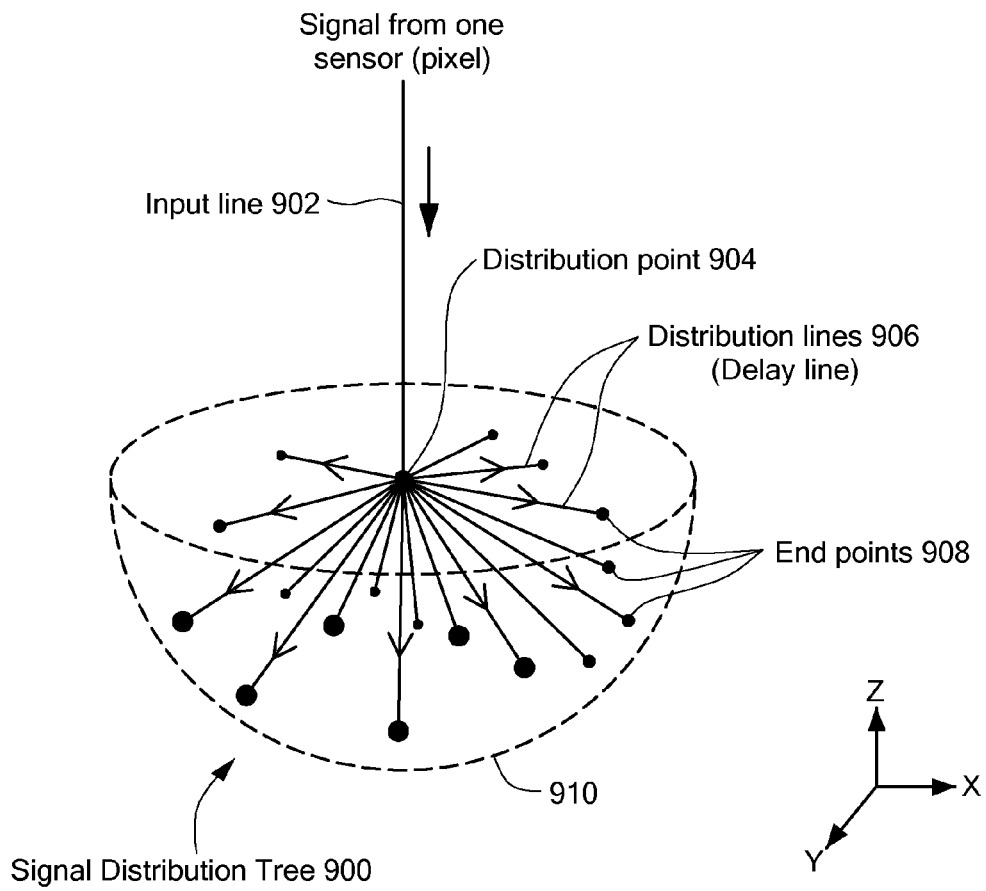
FIG. 9 is a perspective schematic diagram of the signal distribution tree.

A signal distribution tree distributes signals from a single sensor to a plurality of end points. FIG. 9 illustrates an example of such a signal distribution tree 900. In this embodiment, signals from one sensor are received over an input line 902 and are distributed at a distribution point 904, via a plurality of distribution lines 906, to respective end points 908. From the end points, the signals can be transferred to a signal pickup units (described below). In one embodiment, a signal distribution tree includes 32 distribution lines 906, although other numbers of distribution lines are acceptable. The distribution lines 906 are delay lines. In the embodiment shown in FIG. 9, all the distribution lines 906 have identical delay characteristics, thus identical times are taken to propagate a signal from the distribution point 904 to all the end points 908. The end points 908 can be thought of as lying on a surface of a hemisphere 910, and a signal input into the distribution tree 900 arrives simultaneously on the surface of the hemisphere 910. The surface of the hemisphere thus represents an isochrone. The hemisphere 910 need not, however, be a solid surface. Instead, the hemisphere 910 is simply a conceptualization of the collection of end points 908.

The distribution lines 906 form various angles with the input line 902. These angles are preferably randomly assigned among the distribution lines 906, however regularly assigned distribution angles can be used. If regularly assigned distribution angles are used, care should be taken to avoid generating signal artifacts, as discussed in more detail below.

In other embodiments, the distribution lines 906 do not have identical delay characteristics and/or signals can be transferred from the distribution lines to signal pickup units at points along the distribution lines in addition to, or in place of, at the end points 908. Furthermore, shapes other than hemispheres can be used, depending on the type of signal processing to be performed, as discussed in more detail below.

Figure 10:
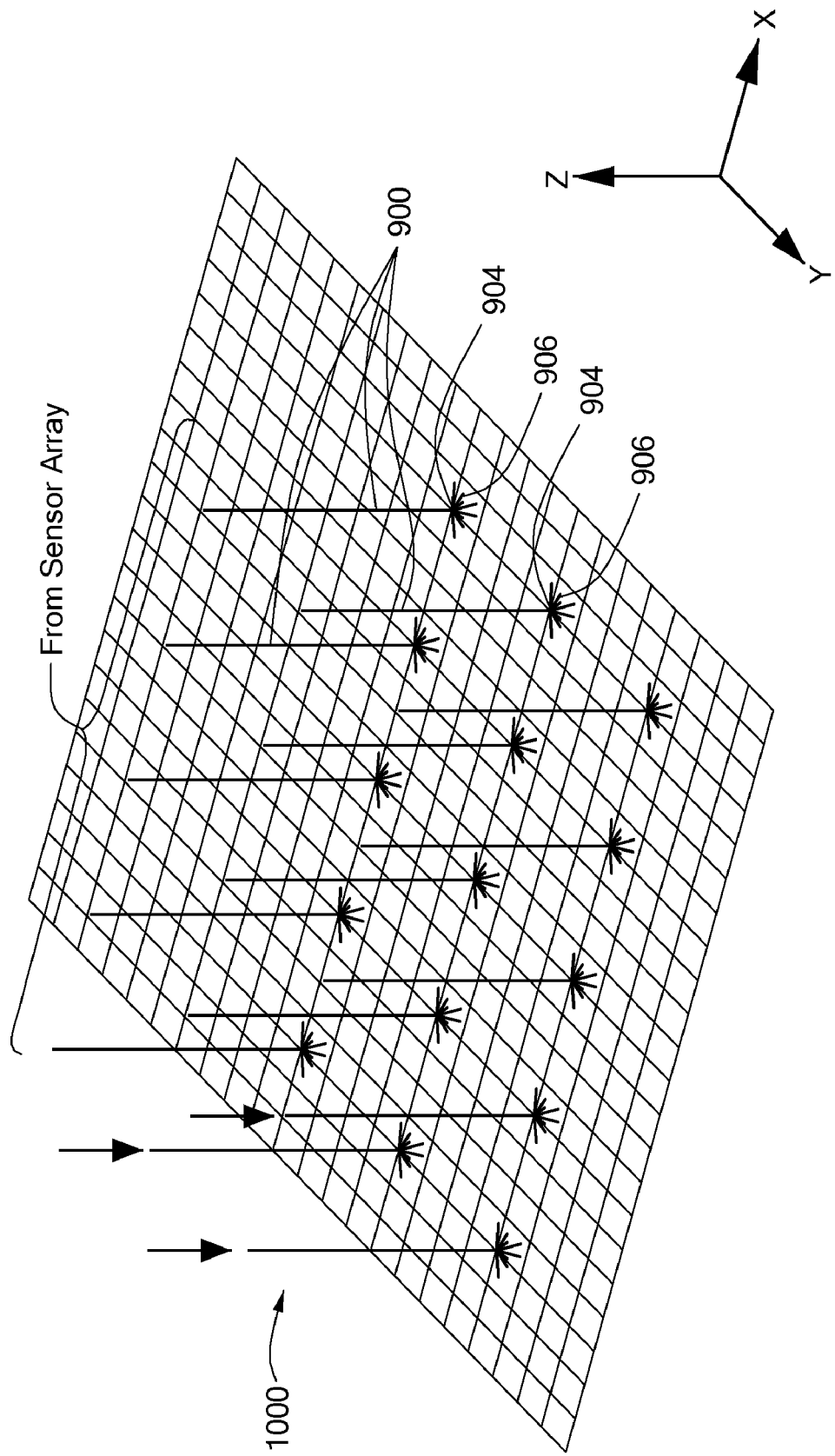
FIG. 10 is a perspective schematic diagram of an array of signal distribution trees.
Figure 11:
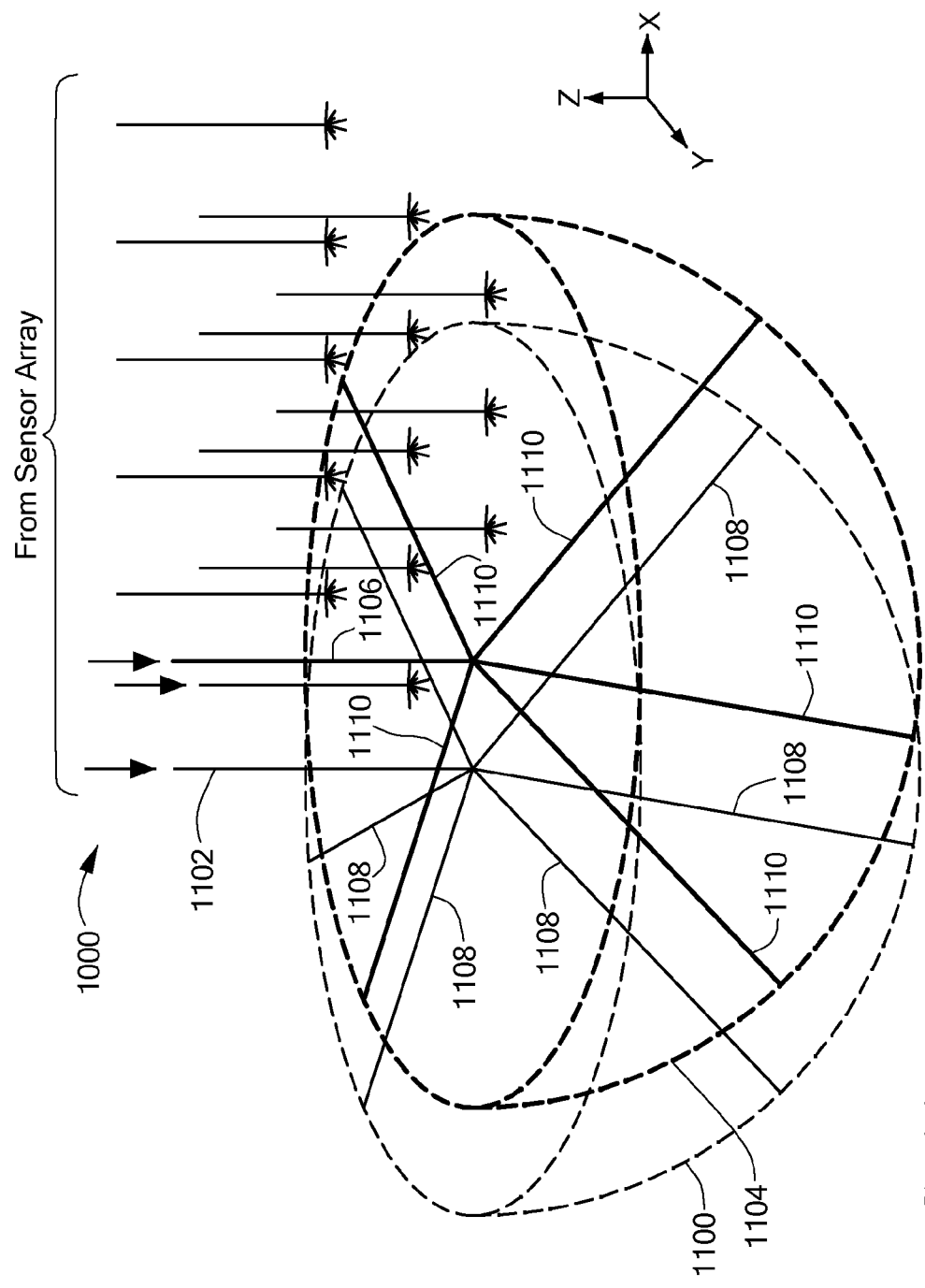
FIG. 11 is a more detailed prospective schematic diagram of the array of signal distribution trees the FIG. 10.

As shown in FIG. 10, a three-dimensional array 1000 of signal distribution trees is formed by arranging a plurality of signal distribution trees 900 on an XY plane. The arrangement can be regular or irregular, although a regular rectangular arrangement (as shown in FIG. 10) is preferred. For simplicity, only a portion of each distribution line 906 adjacent its respective distribution point 904 is shown in FIG. 10, thus each signal distribution tree in FIG. 10 resembles a brush that has had its bristles clipped short. Although not shown in FIG. 10, the hemispheres of several neighboring signal distribution trees 900 partially overlap each other. This overlap is shown in FIG. 11, where hemisphere 1100 of a first signal distribution tree 1102 partially overlaps hemisphere 1104 of a second signal distribution tree 1106. Thus, the distribution lines 1108 of the first signal distribution tree 1102 partially mesh with the distribution lines 1110 of the second signal distribution tree 1106, somewhat the way bristles of two brushes mesh when the brushes are held parallel and then pressed together, although the signal distribution trees are preferably arranged so that the distribution lines of one tree do not touch the distribution lines of another tree.

In addition to distributing signals among end points of trees (including hemispheres and other shapes), other embodiments distribute signals across other shapes of surfaces, two- and three-dimensional geometric shapes, volumes, groups of lines, distributed (i.e. disconnected) shapes, volumes, etc.

Signal Pickup Unit

Figure 12:
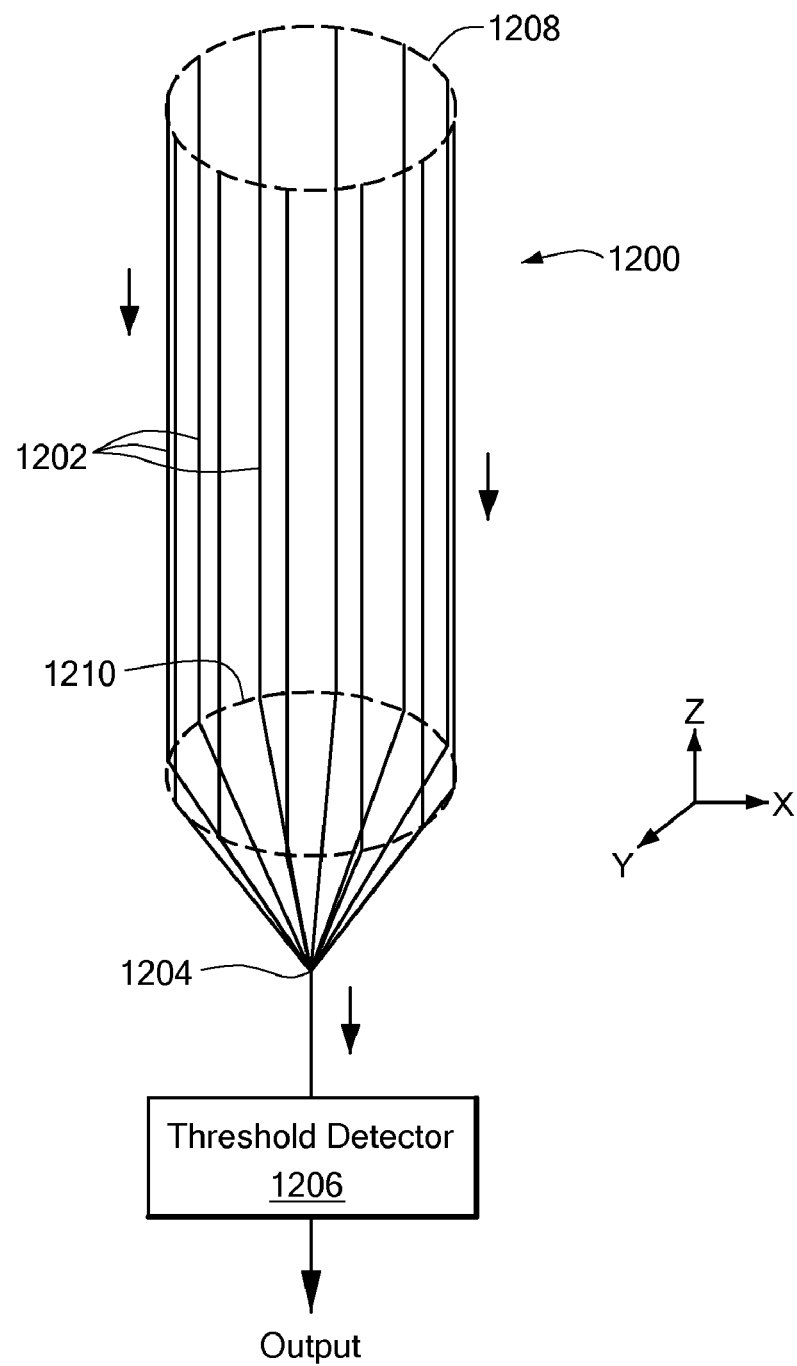
FIG. 12 is a perspective schematic diagram of a signal pickup unit.

A plurality of signal pickup units interdigitate with the distribution lines in the array 1000 of signal distribution trees to receive signals from the signal distribution trees. FIG. 12 shows one embodiment of a signal pickup unit 1200. A set of parallel pickup lines, such as those shown at 1202, converge at a common point 1204 to feed a threshold detector 1206. For visual scene processing, one type of pickup line 1202 is preferably arranged in a tube shape, as indicated by dashed circles 1208 and 1210; other shapes are discussed below. In some embodiments, the pickup lines 1202 are delay lines. In other embodiments, the pickup lines 1202 are not delay lines. Diodes, amplifiers or other buffers (not shown) can be placed between each of the pickup lines 1202 and the common point 1204 to prevent crosstalk between the pickup lines.

If the threshold detector 1206 detects at least a predetermined level of signal or signals on the pickup lines 1202, the threshold detector generates an output signal. In some embodiments, analog signals on the pickup lines 1202 are summed, and the threshold detector 1206 compares the sum to a predetermined value. If the sum at least equals the predetermined value, the threshold detector 1206 generates the output signal. In other embodiments, each of the pickup lines 1202 terminates at the threshold detector 1206, and the threshold detector ascertains the number of pickup lines that carry signals of at least a predetermined magnitude. If at least a predetermined number of the pickup lines 1202 carry such a signal, the threshold detector 1206 generates the output signal. For example, the pickup lines 1202 can carry logic-level signals, and if at least a predetermined number of the pickup lines carry TRUE signals, then the threshold detector 1206 generates the output signal.

Figure 13:
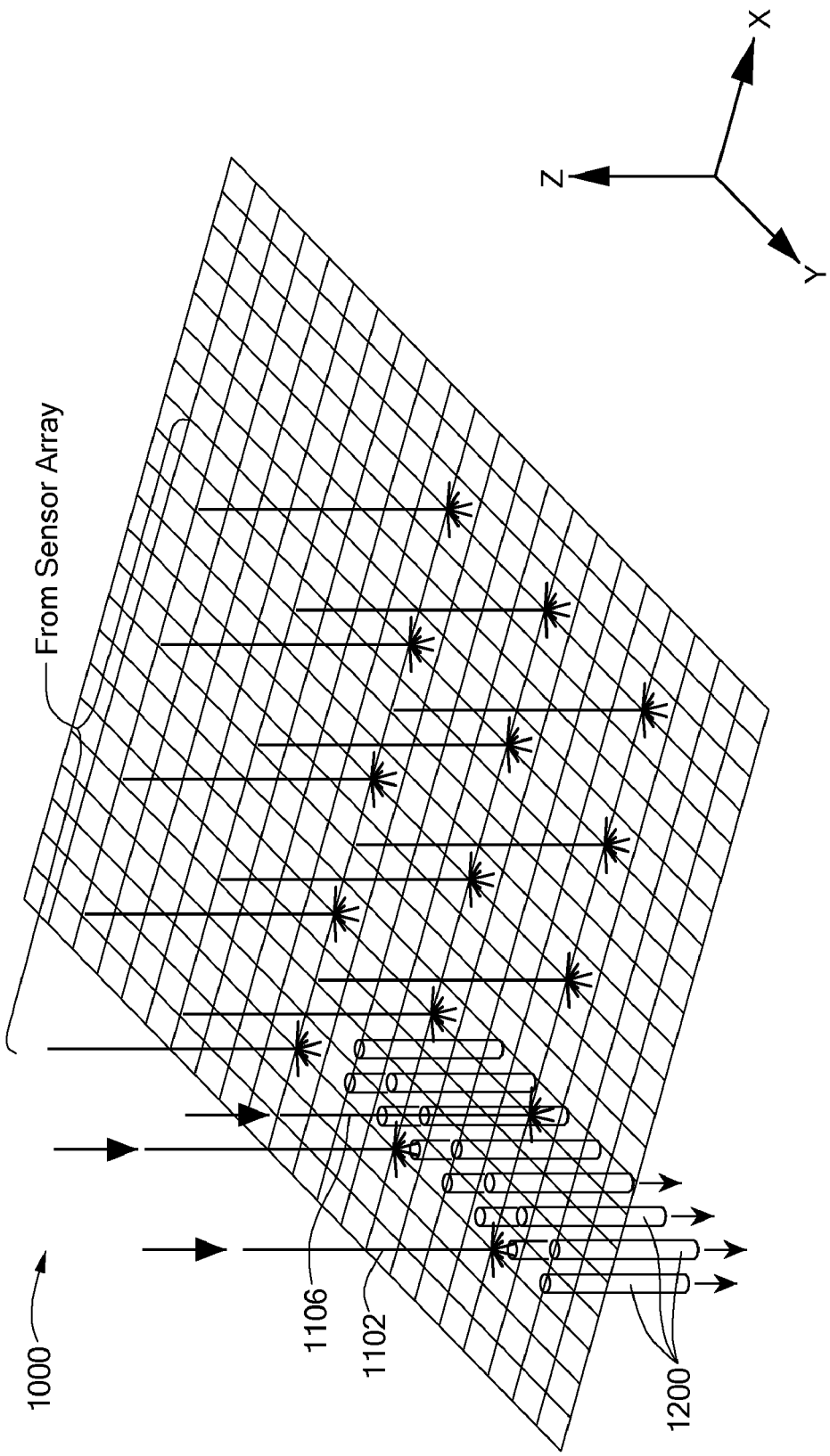
FIG. 13 is a perspective schematic diagram of a set of the signal pickup units of FIG. 12 interdigitated with the array of signal distribution trees the FIG. 10.

A plurality of signal pickup units 1200 interdigitate with the distribution lines in the array 1000 of signal distribution trees, as shown in FIG. 13. The density of the signal pickup units 1200 is preferably higher than the density of signal distribution trees in the array 1000. For simplicity, each signal pickup unit 1200 is shown in FIG. 13 as a tube, although, as noted above, each signal pickup unit includes a plurality of pickup lines 1202, not a solid-walled tube. Interdigitating the signal pickup units 1200 with the array 1000 of signal distribution trees can be visualized by imagining inserting the tines of a tubular comb up into the bottom of the array 1000 of signal distribution trees.

Figure 14:
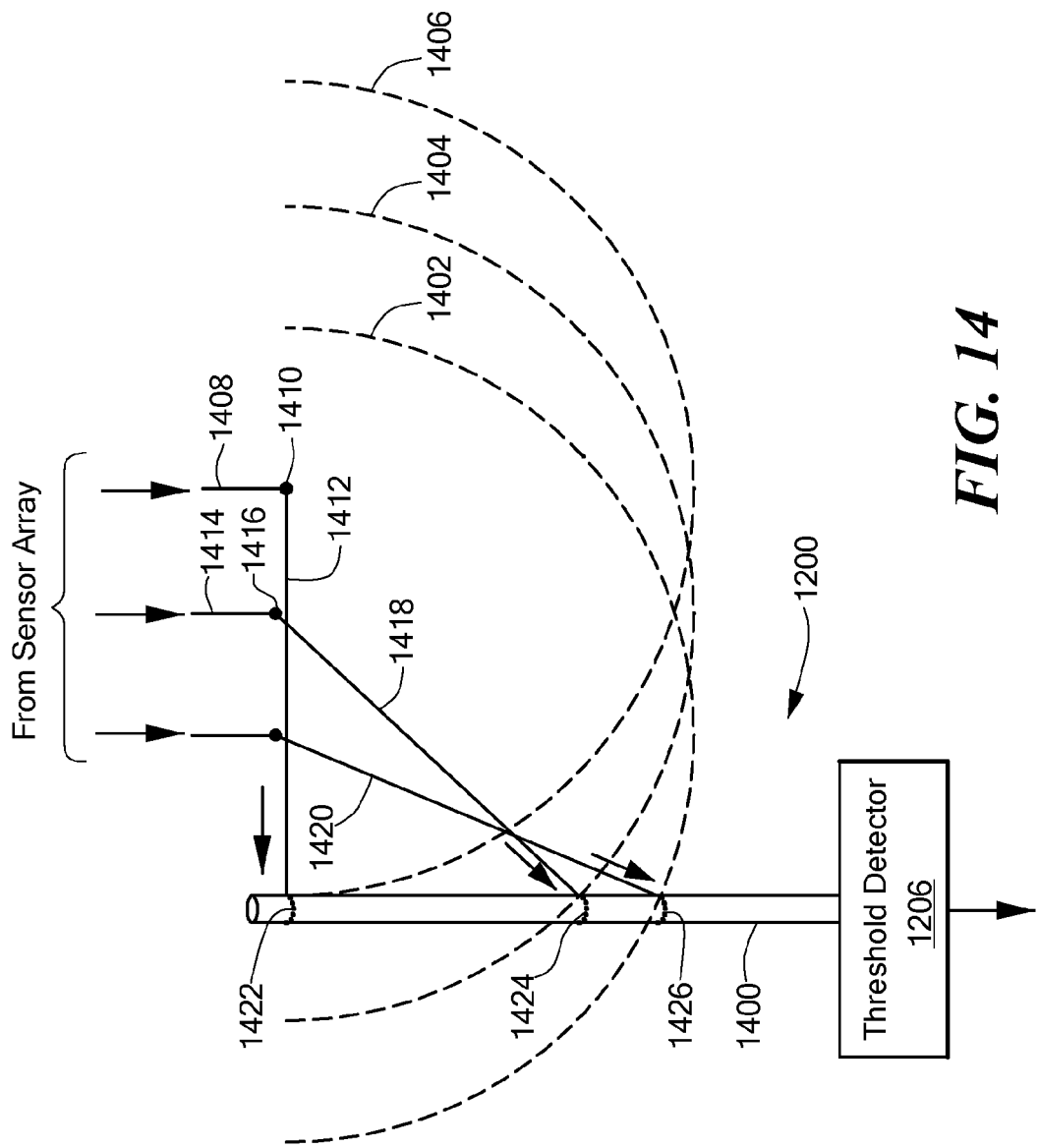
FIG. 14 is a detailed schematic diagram (side view) of a portion of the complex shown in FIG. 13.

The pickup lines 1202 (FIG. 12) connect to the end points 908 (FIG. 9) of the signal distribution trees 900 of the array 1000 (FIG. 13) to receive signals from particular signal distribution trees. FIG. 14 shows the interconnection of one signal pickup unit 1200 to portions of three signal distribution trees 1402, 1404 and 1406. The signal distribution trees are shown by dashed lines 1402, 1404 and 1406 representing the respective end-point hemispheres of the trees. Each of the three signal distribution trees 1402-1406 is connected to a sensor 406 (FIG. 4) that lies along a different concentric Airy ring created by a common point in the field of view. There are, of course, other signal distribution trees connected to other sensors that also lie along these Airy rings. However, for simplicity, these other signal distribution trees are not shown in FIG. 14. Also for simplicity, the pickup lines of the signal pickup unit 1200 are depicted as a single tube 1400. In this embodiment, the signal pickup lines are not delay lines.

The first signal distribution tree 1406 includes an input line 1408 from one of the sensors 406. Signals on the input line 1408 are distributed at the distribution point 1410 to distribution lines, one of which is shown at 1412. As noted, the distribution lines radiate from the distribution point 1410 at various angles. Distribution line 1412 is horizontal or nearly horizontal. The end of the distribution line 1412 furthest from the distribution point 1410 connects to one of the pickup lines of the pickup unit 1200 near the top of the pickup line 1400.

The second signal distribution tree 1404 includes an input line 1414 from a different one of the sensors 406 on the sensor surface 402. Signals on the input line 1414 are distributed at the distribution point 1416 to distribution lines, one of which is shown at 1418. As can been seen in FIG. 14, distribution line 1418 descends from the distribution point 1416 at an angle and connects to the pickup line 1400 nearer the bottom of the pickup line than the distribution line 1412 of the first tree 1606.

A third signal distribution tree 1402 is similarly connected to the signal pickup unit 1200. The distribution line 1420 of the third signal distribution tree 1402 descends at a steeper angle than the distribution line 1418, and the distribution line 1420 of the third signal distribution tree connects to the signal pickup line 1400 close to the bottom of the signal pickup line.

As noted, the distribution lines 1412, 1418 and 1420 are delay lines having identical delay characteristics. The signal pickup line 1400 is not a delay line in this embodiment. Thus, signals arriving simultaneously or nearly simultaneously from the three sensors 406 connected to the three signal distribution trees 1402-1406 arrive simultaneously or nearly simultaneously at the threshold detector 1206. Thus, if concentric Airy rings from a single point in the field of view fall on the sensors 406 that are connected to the three signal distribution trees 1402-1406, the threshold detector 1206 produces an output signal representing the point in the field of view.

Figure 15:
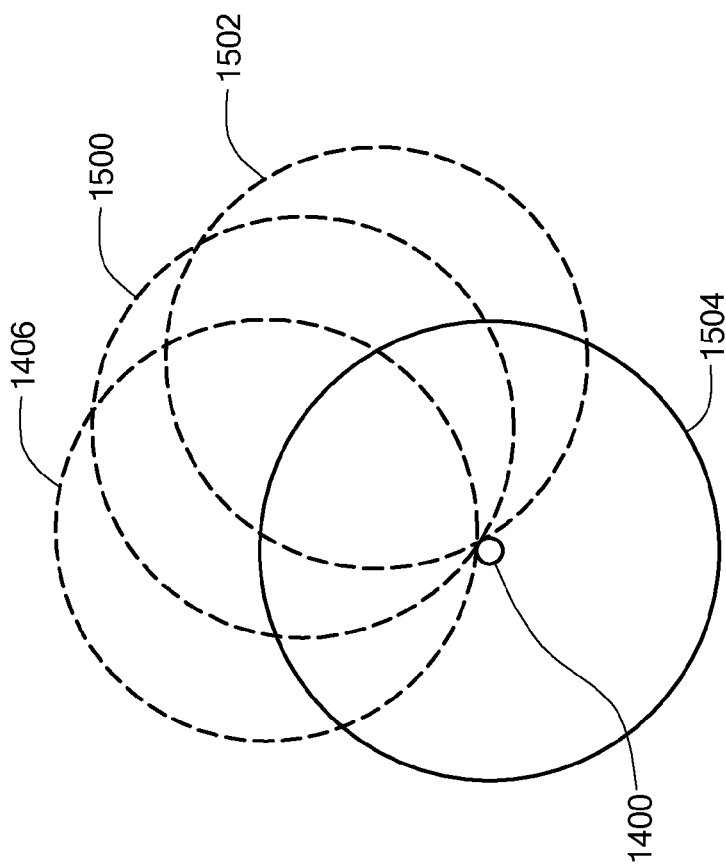

As noted, other signal distribution trees are connected to other sensors 406 that lie along the detected Airy rings. These other signal distribution trees are not shown in FIG. 14, but some of these other signal distribution trees are depicted in FIG. 15. While FIG. 14 is a side view of the signal distribution trees 1402-1406 and the interconnections with the signal pickup unit 1200, FIG. 15 is a top view of three signal distribution trees 1406, 1500 and 1502 and their interconnections with the signal pickup line 1400. The signal distribution trees 1406, 1500 and 1502 are centered along a circle 1504. The signal distribution trees 1406, 1500 and 1502 receive signals from sensors 406 that lie along an outer Airy ring. The distribution lines for these signal distribution trees are all horizontal or nearly horizontal, as was noted with respect to the distribution line 1412 (FIG. 14).

Figure 16:
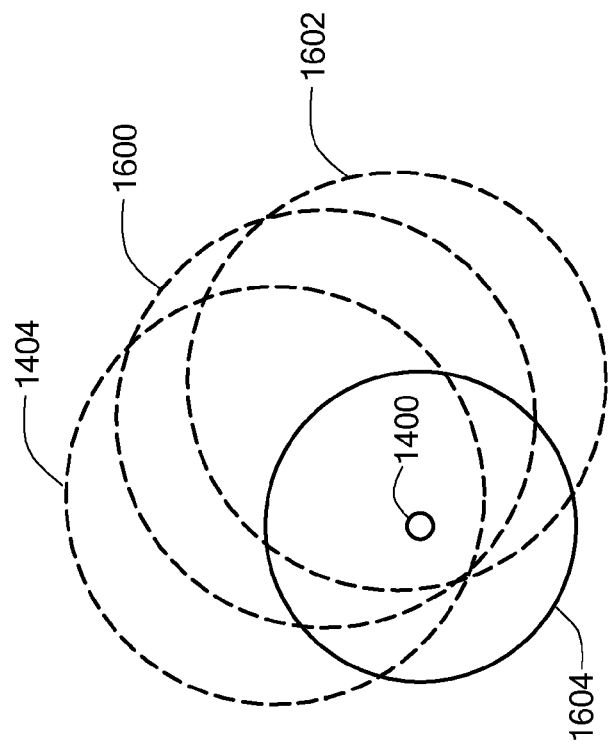
FIGS. 15 and 16 are schematic diagrams (top views) of portions of the complex shown in FIG. 13.

FIG. 16 is another top view of three other signal distribution trees 1404, 1600 and 1602. These signal distribution trees are connected to sensors 406 that lie along an Airy ring that is smaller in diameter than the Airy ring noted with reference to FIG. 15. The signal distribution trees 1404, 1600 and 1602 are centered along a circle 1604 that is smaller in diameter than the circle 1504 shown in FIG. 15. As noted with respect to FIG. 14, the distribution line 1418 descends at an angle toward the signal pickup line 1400. The distribution lines for the signal distribution trees 1404, 1600 and 1602 descends at identical angles.

Returning to FIG. 14, and as noted above, signals from various diameter Airy rings are introduced into the signal pickup line 1400 at various heights. For example, signals from larger diameter Airy rings are introduced higher along the signal pickup line 1400, and signals from smaller diameter Airy rings are introduced lower along the signal pickup line. Also as noted above, signals from several signal distribution trees (originating from pixels along a single Airy ring) are introduced into the signal pickup line 1400 at a given level. A dashed band 1422 represents connections from signal distribution lines connected to signal distribution trees that are not shown in FIG. 14 but that, nonetheless, introduce signals into the signal pickup line 1400 at that level.

As is well known, a given point projects different size Airy disks (and different size sets of Airy rings), depending on the size of the aperture through which an image of the point is projected. A larger aperture produces smaller Airy disks and Airy rings, and vice versa. Thus, if the size of the aperture 404 is changed, a different set of Airy rings is projected on the sensor surface 402, although all such sets of Airy rings have a common center, corresponding to the location of the signal pickup line 1400. If a different set of Airy rings is projected on the sensor surface 402, a different set of sensors 406 is illuminated, and a different set of signal distribution trees (not shown) carry signals, via their respective signal distribution lines (not shown), to the signal pickup line 1400. As just noted, signals from these other signal distribution lines are introduced into the signal pickup line 1400 at different levels. The signal pickup unit 1200 can be modified to make it more sensitive to a particular set of Airy rings or to make it exclusively sensitive to that set of Airy rings. For example, selected bands of the signal pickup line 1400 (such as band at 1422, 1424 and 1426) can be made sensitive, while the remainder of the signal pickup line is made less sensitive or insensitive to signals from signal distribution lines.

Also as is well known, decreasing an aperture size optimizes an optical system for receiving signals from small objects in a field of view, whereas increasing the aperture size optimizes the optical system for receiving signals from larger objects. In accordance with the present disclosure, different sets of bands on the signal pickup unit 1200 can be sensitized and desensitized to make the signal pickup unit relatively more sensitive to the size of the Airy rings that are produced by the selected aperture size.

If a moving object projects a set of Airy rings onto the sensor surface, the set of Airy rings moves across the sensor surface. As the set of Airy rings approaches a set of sensors connected to a signal pickup unit, noise is generated by the transients caused by dark bands between the Airy rings passing over the sensors. However, when the Airy rings become centered on the signal pickup unit, many simultaneous transients into and out of the dark bands converge to generate a signal that exceeds this noise.

Figure 35:
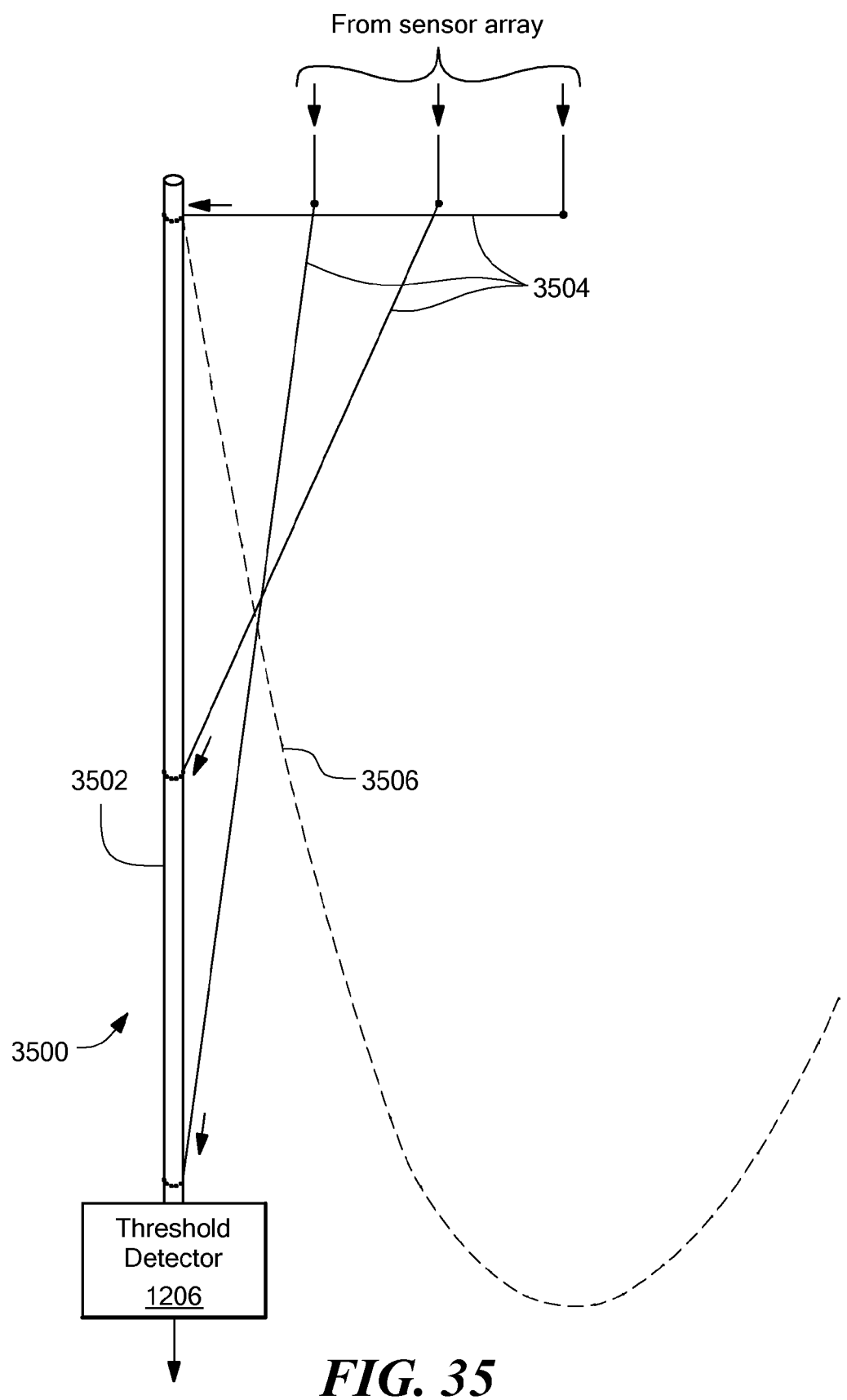
FIG. 35 is a detailed schematic diagram (side view) of a portion of an alternative embodiment of the complex shown in FIG. 13.

The signal pickup unit 1200 discussed with reference to FIGS. 12-16 includes signal pickup lines 1202 that are not delay lines. In an alternative embodiment shown in FIG. 35, the signal pickup unit 3500 includes signal pickup lines (for simplicity, depicted as a tube 3502) that are delay lines. In this embodiment, the signal distribution delay lines 3504 are slower than the signal pickup delay lines 3502. In addition, the surface 3506 of the signal distribution tree is distorted, so signals from the various Airy rings arrive simultaneously or nearly simultaneously at the threshold detector 1206.

Correcting Chromatic Aberrations

Figure 17:
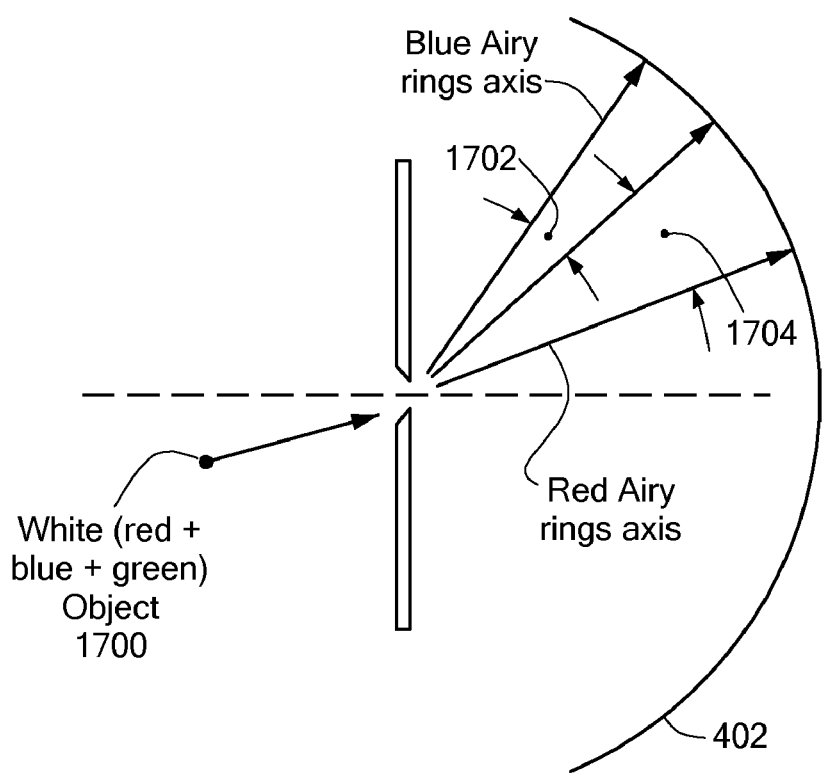
FIG. 17 is a schematic diagram of an optical system that includes an aperture and a sensor surface, including diffraction of white object.
Figure 18:
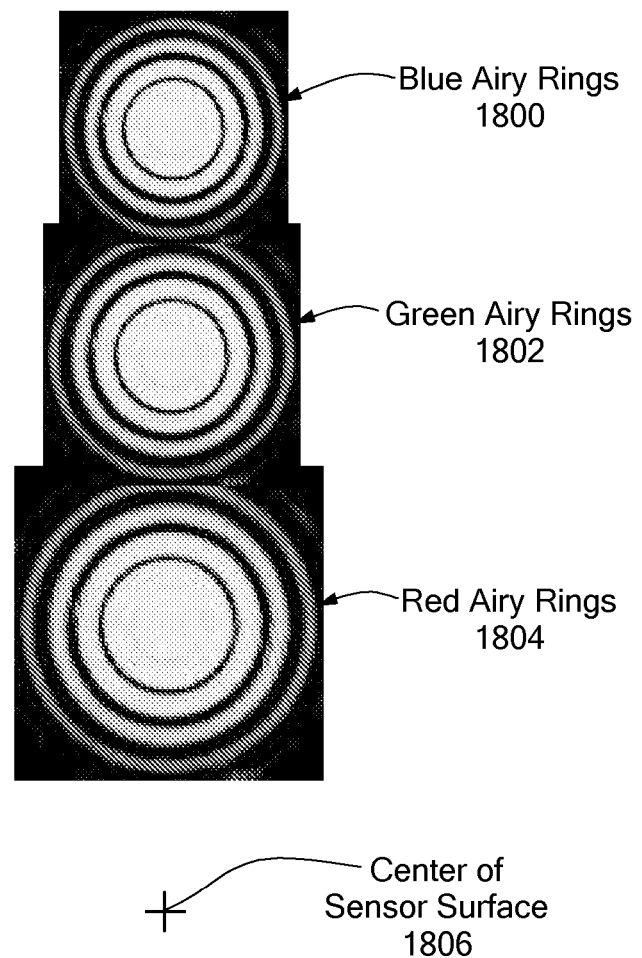
FIG. 18 is a set of three Airy disks and Airy rings projected within the optical system of FIG. 17.

As noted with respect to FIG. 4, a monochromatic object casts a set of Airy rings due to diffraction caused by an aperture. A shown in FIG. 17, a white object 1700 composed of a red, a blue and a green light source casts three Airy rings, one for each colored light source in the object. As shown in FIG. 18, the Airy rings 1800 created by the shorter wavelength (such as blue) light are smaller than the Airy rings 1804 created by the longer wavelength (such as red) light. In addition, if the object 1700 is off-axis, the Airy rings are projected at various angles depending on the wavelength of the light. Thus, the Airy disks and rings for the various colors of the object are not registered (do not fall on top of each other) on the sensor surface 402. In uncorrected optical systems, this phenomenon creates blue and/or red fringes on images.

Figure 19:
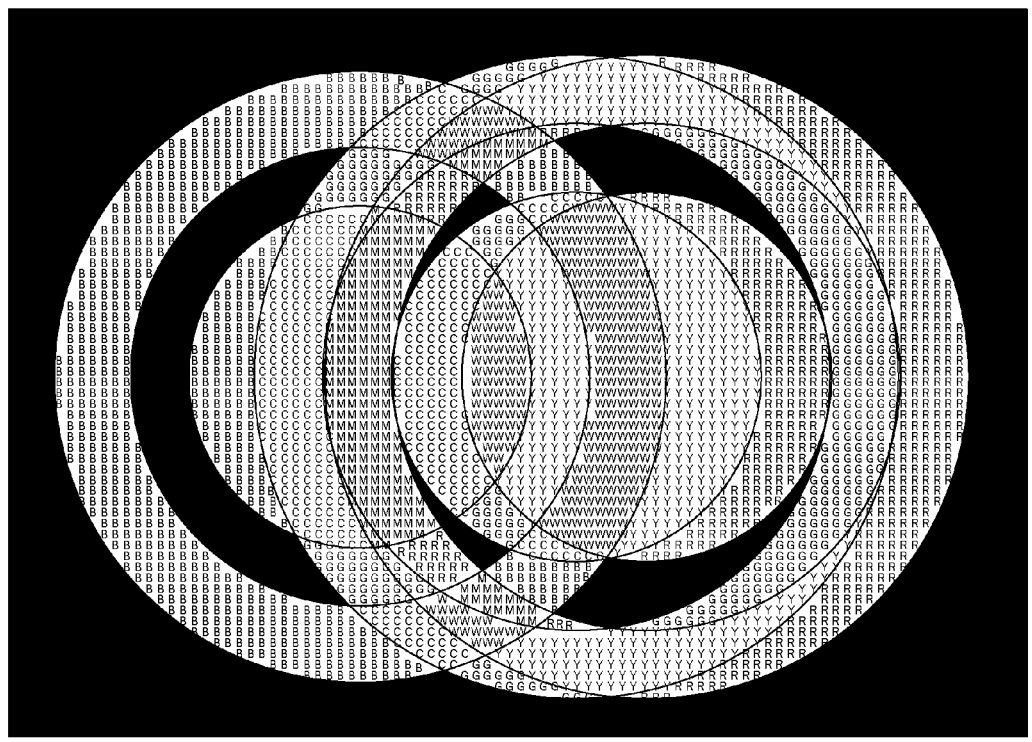
FIG. 19 is another set of three Airy disks and Airy rings projected within the optical system of FIG. 17.

Shorter wavelength light is refracted more than longer wavelength light. Thus, as shown in FIG. 18, the blue Airy rings 1800 are projected further from the center 1806 of the sensor surface than the red Airy rings 1804. Furthermore, the difference 1702 between the diffraction angles of the blue Airy rings 1800 and the green Airy rings 1802 is greater than the difference 1704 between the diffraction angles of the red Airy rings 1804 and the green Airy rings 1802. Although FIG. 18 shows the Airy disks somewhat separated from each other, in many circumstances these disks are likely to be closer together, yielding an image similar to that shown in FIG. 19.

Figure 20:
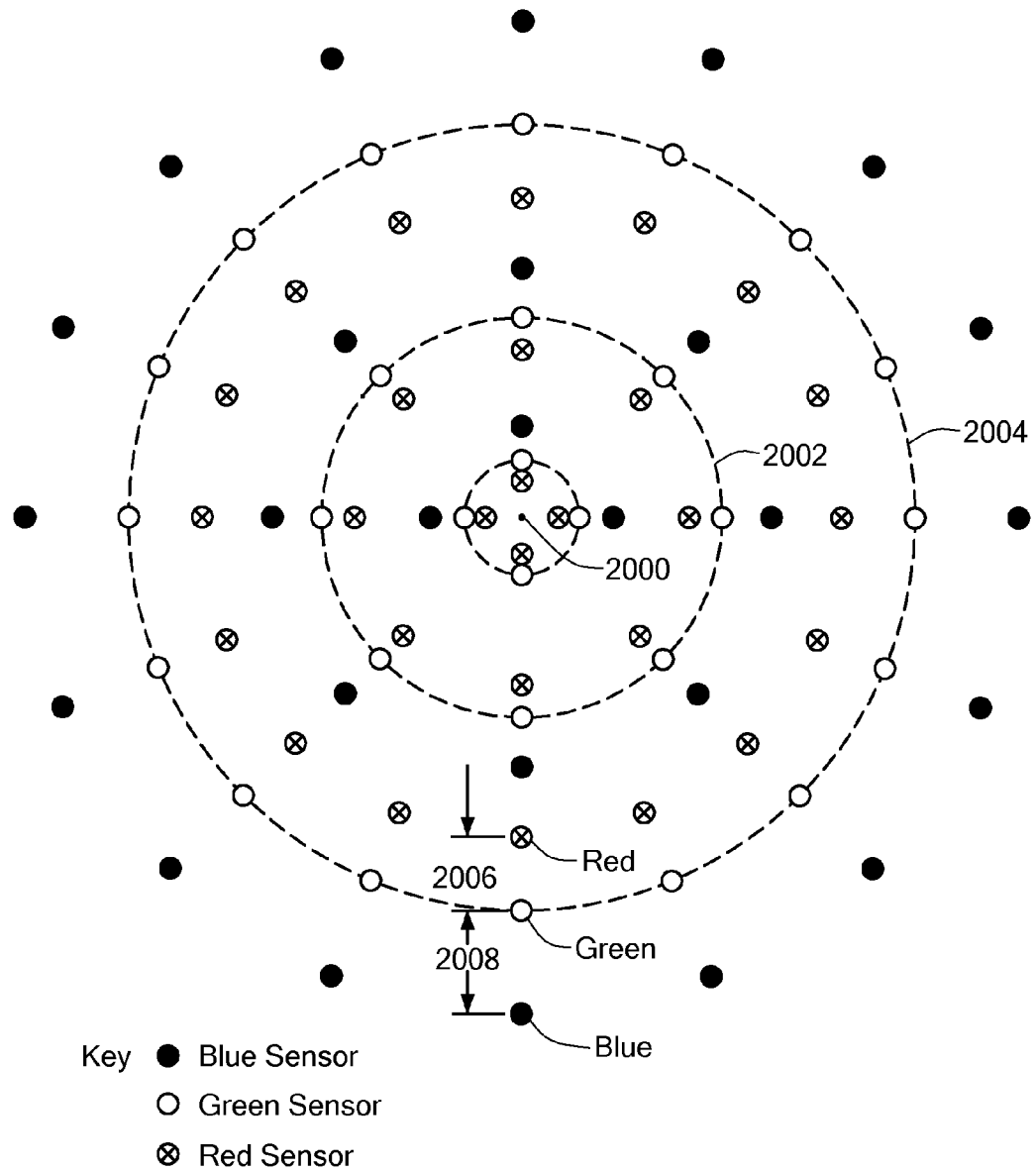
FIG. 20 is a schematic diagram of color-sensitive sensors on a sensor array.

In embodiments of the presently disclosed system, color-sensitive sensors are disposed on the sensor surface in positions that compensate for the wavelength-dependent diffraction described above, as shown in FIG. 20. For each point 2000 that can be the center of an Airy disk, dashed circles 2002 and 2004 around the point represent the average diameter of Airy rings that would be projected on the sensor surface. Green-sensitive sensors (represented by open circles in FIG. 20) are disposed at least along the circles 2002 and 2004. Blue-sensitive sensors (represented by filled circles in FIG. 20) are disposed at least along circles (not shown) that have diameters that are larger than the circles 2002 and 2004, respectively. Similarly, red-sensitive sensors (represented by circles enclosing Xs in FIG. 20) are disposed at least along circles (not shown) that have diameters that are smaller than the circles 2002 and 2004, respectively. The difference 2006 in radius between the red-sensitive sensor circle and the green-sensitive sensor circle is less than the difference 2008 in radius between the blue-sensitive sensor circle and the green-sensitive sensor circle.

Although the red-sensitive and blue-sensitive sensors are disposed along circles that have different radii than the circles along which corresponding green-sensitive sensors are disposed, outputs from all three color sensitive sensors are treated as though the sensors were all co-located with their respective green-sensitive sensors. That is, signals from the blue-sensitive sensors are projected radially inward, toward the center of the circles 2002 and 2004 by a displacement, such as 2008, before these signals are passed to subsequent stages for processing. Consequently, these signals are treated as though they we generated by sensors disposed along the circles 2002 and 2004. When these signals are processed, the coordinates of the blue-sensitive sensors are considered to be along the circles 2002 and 2004.

Similarly, signals from the red-sensitive sensors are projected radially outward, away from the center of the circles 2002 and 2004, by a displacement, such as 2006, before these signals are passed to subsequent stages for processing.

These placements are significant, because the locations of signal distribution trees, such as 1102 and 1106 (FIG. 13), relative to the locations of signal pickup units partially determine the type of processing that is performed by the combination of the signal distribution trees and the signal pickup units. Displacing the signals from the red-sensitive and blue-sensitive sensors re-registers these signals with signals from the green-sensitive sensors before all these signals are processed by the signal distribution tree/signal pickup units complex.

Of course, more than two circles of sensors can be used to detect more than two Airy rings. In addition, the embodiment described above is designed for systems that detect visible light. In systems that detect other wavelengths or only a subset of the visible spectrum, sensors that are sensitive to other wavelengths (such as ultraviolet, infrared or a different subset of the visible spectrum) can be used. In addition, these wavelength-sensitive sensors can be positioned appropriately (i.e., an appropriate distance inward or outward), taking into account the differences in diffraction angles for the various wavelengths that are to be detected. Thus, an aperture-based imaging system, such as the one shown in FIG. 4, can produce achromatic images without the use of an achromatic lens.

Other optical systems create chromatic aberrations that are the reverse of those described above. That is, shorter wavelengths (such as blue) are diffracted less than longer wavelengths (such as red). In such optical systems, the displacements of the wavelength-sensitive sensors is reversed.

Correlating Signal Pickup Unit Shape to Aperture Shape

The shape of a diffraction pattern depends on the shape of the aperture that causes the diffraction. For example, a circular aperture produces a circular Airy disk and circular Airy rings. A horizontally-oriented slit produces a vertically-oriented diffraction pattern. The signal pickup unit 1200 discussed with reference to FIG. 12 has a circular cross-sectional shape, and it is well-suited for detecting circular Airy rings. Other shapes of signal pickup units are well-suited for detecting diffraction patterns produced by apertures having other shapes. In general, the cross-section shape of a signal pickup unit should correspond to the shape of the diffraction pattern produced by the aperture of interest. If the aperture changes shape, for example the way a cat's pupil changes shape as it opens and closes, a variety of shaped signal pickup units with appropriate cross-sectional shapes can be included and connected to the signal distribution tree. Consequently, whichever shape the aperture takes on, an appropriate signal pickup unit will receive signals from the signal distribution tree. The variety of signal pickup units can be connected together with summing or ORing circuits. Alternatively, the signals from the variety of signal pickup units can be processed separately and/or in parallel for a variety of purposes. Alternatively, the cross-sectional shape of the signal pickup unit changes in response to a change in the shape of the aperture.

Structures Shaped to Detect Motion

Figure 21:
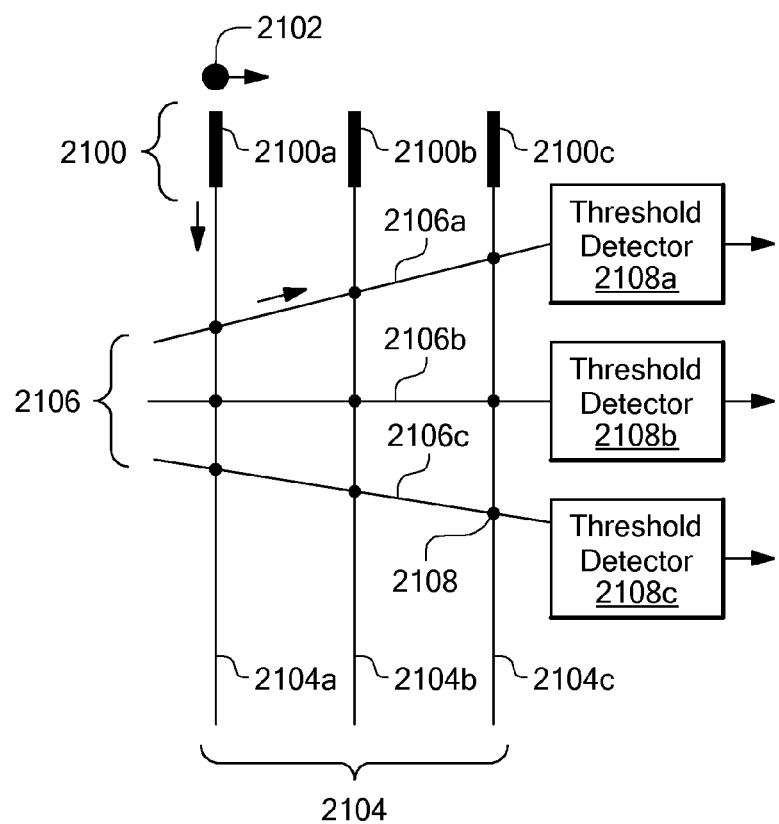
FIG. 21 is a schematic diagram of a moving-object detector.

Signal distribution trees and signal pickup units can be shaped and configured to detect objects moving at a particular speed or within a range of speeds. An example of such a configuration is shown in FIG. 21. Sensors 2100 detect changes in contrast in the respective detector's field of view, for example as an object 2102 enters and leaves the detector's field of view. As each of the sensors 2100 detects an object 2102 entering its field of view, the sensor sends a signal down its respective signal distribution line 2104. Each signal distribution line 2104 is a degenerate signal distribution tree, i.e. a tree having only one branch. Each signal distribution line 2104 is a tapped delay line.

Signal pickup lines 2106 cross the signal distribution lines 2104 at various angles. Each of the signal pickup line angle (thus each signal pickup line 2106) is used to detect objects moving at a different speed or within a relatively narrow range of speeds. The signal pickup lines 2106 are delay lines that carry signals from left to right to respective threshold detectors 2108. Each signal pickup line 2106 is a degenerate signal pickup unit, i.e. a signal pickup unit having only one signal pickup line.

There is no relationship between the number of signal pickup lines 2106 and the number of signal distribution lines 2104. FIG. 21 shows three of each of these lines purely as a matter of illustration convenience.

A signal enforcement point, such as the one indicated at 2110, is disposed at each intersection between a signal pickup line 2106 and a signal distribution line 2104. When a signal traveling down a signal distribution line 2104 reaches a signal enforcement point 2110, the signal enforcement point injects a signal into the corresponding signal pickup line 2106 or modifies a signal that is already present on the signal pickup line. In general, the signal enforcement point 2110 raises the level of the signal on the signal pickup line 2106. For example, if the signal distribution line 2104 and the signal pickup line 2106 are analog lines, the signal enforcement point sums the signals on the two lines and injects a signal representing the sum into the signal pickup line. Thus, if a sufficient number of signal enforcement points 2110 inject signals or raise the level of a signal on a particular signal pickup line 2106, a sufficiently high signal (or a sufficiently large number of pulses within a prescribed time period) reaches the respective threshold detector 2108 to trigger the threshold detector, and the threshold detector then produces an output signal. The output signal indicates detection of an object traveling at the particular speed or within the particular range of speeds.

Figure 22D:
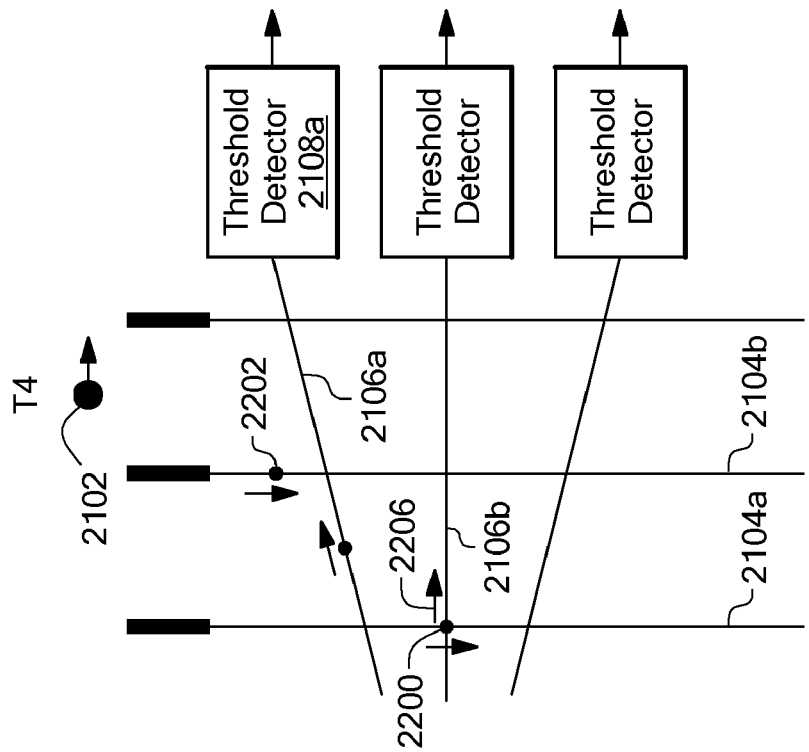

Operation of the embodiment shown in FIG. 21 is illustrated via a set of time-sequenced "frames" (FIGS. 22*a*-22*h*). At time T1, as shown in FIG. 22*a*, sensor 2100*a* detects an object 2102 and sends a signal 2200 down its corresponding signal distribution line 2104*a*.

At time T2, as shown in FIG. 22*b*, the object 2102 has passed sensor 2104, but has not yet reached sensor 2104*b*, and the signal 2200 has progressed part way down the signal distribution line 2104*a*.

Figure 22C:
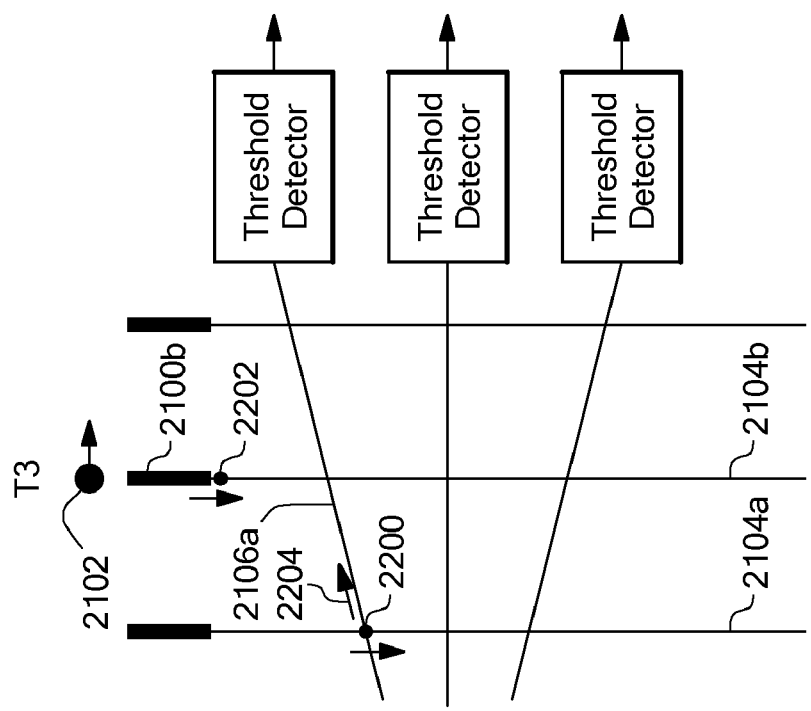

At time T3, as shown in FIG. 22*c*, the object 2102 is detected by sensor 2100*b*, which sends a signal 2202 down its corresponding signal distribution line 2104*b*. The earlier-sent signal 2200 reaches the signal pickup line 2106*a*, and the signal enforcement point at the intersection of signal distribution line 2104*a* and signal pickup line 2106*a* generates a signal 2204 on the signal pickup line 2106*a*.

At time T4, as shown in FIG. 22*d*, the signal 2200 traveling down signal distribution line 2104*a* reaches signal pickup line 2106*b*, and the signal enforcement point at that intersection generates a signal 2206 on the signal pickup line. The signal 2202 traveling down signal distribution line 2104*b* has not yet reached signal pickup line 2106*a*.

Figure 22F:
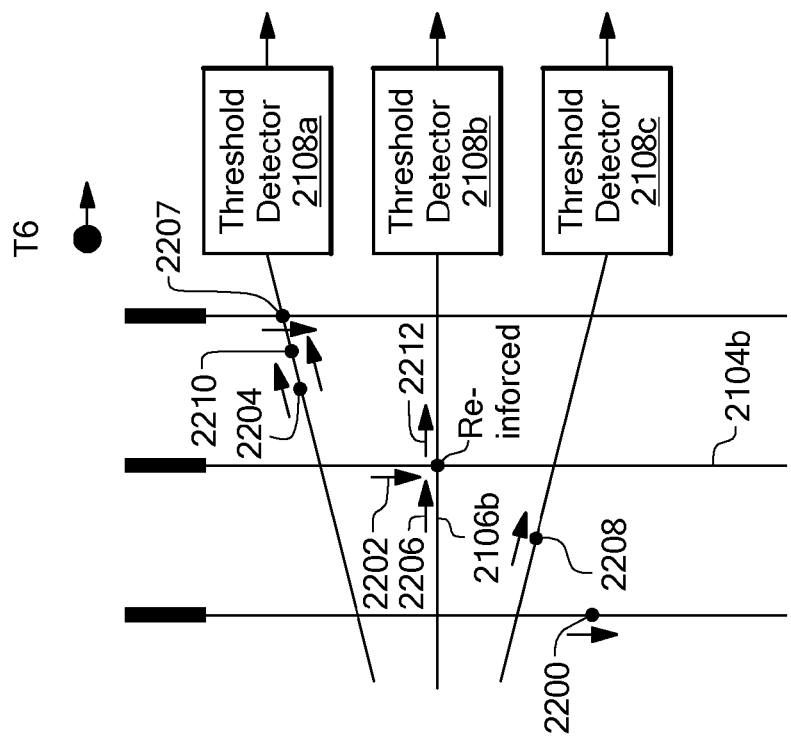
Figure 22E:
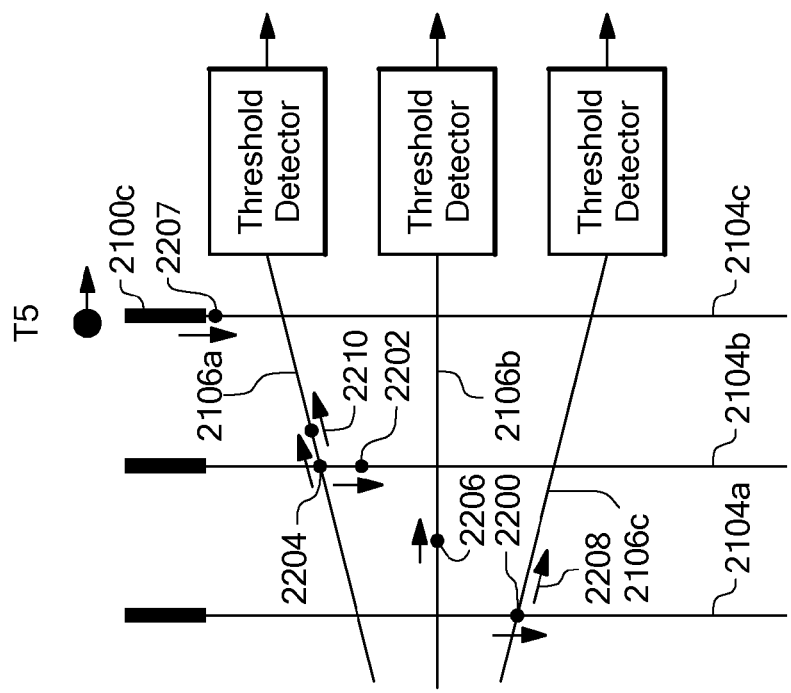

At time T5, as shown in FIG. 22*e*, the object 2102 is detected by sensor 2100*c*, which sends a signal 2207 down its corresponding signal distribution line 2104*c*. In addition, the signal 2200 traveling down the signal distribution line 2104*a* reaches signal pickup line 2106*c*, and the signal enforcement point at that intersection generates a signal 2208 on the signal pickup line. The signal 2204 traveling along signal pickup line 2106*a* reaches signal distribution line 2104*b*. However, by this time, the signal 2202 traveling down signal distribution line 2104*b* has already passed signal pickup line 2106*a*. Thus, the signal 2204 is not raised by the signal enforcement point at the intersection of signal distribution line 2104*b* and signal pickup line 2106*a*.

Earlier, between times T4 and T5, when the signal 2202 traveling down signal distribution line 2104*b* reached signal pickup line 2106*a*, there was no signal present at the intersection of the signal distribution line 2104*b* and the signal pickup line 2106*a*. At that time, the signal 2202 triggered the signal enforcement point to generate a signal 2210 on the signal pickup line 2106*a*, but the signal 2202 did not trigger the signal enforcement point to generate a summed signal.

At time T6, as shown in FIG. 22*f*, signal 2206 traveling along signal pickup line 2106*b* reaches signal distribution line 2104*b* at the same time as the signal 2202 traveling down the signal distribution line 2104*b* reaches the intersection. The signal enforcement point at the intersection sums the two signals 2206 and 2202 and sends a summed signal 2212 along the signal pickup line 2106*b*.

Figure 22H:
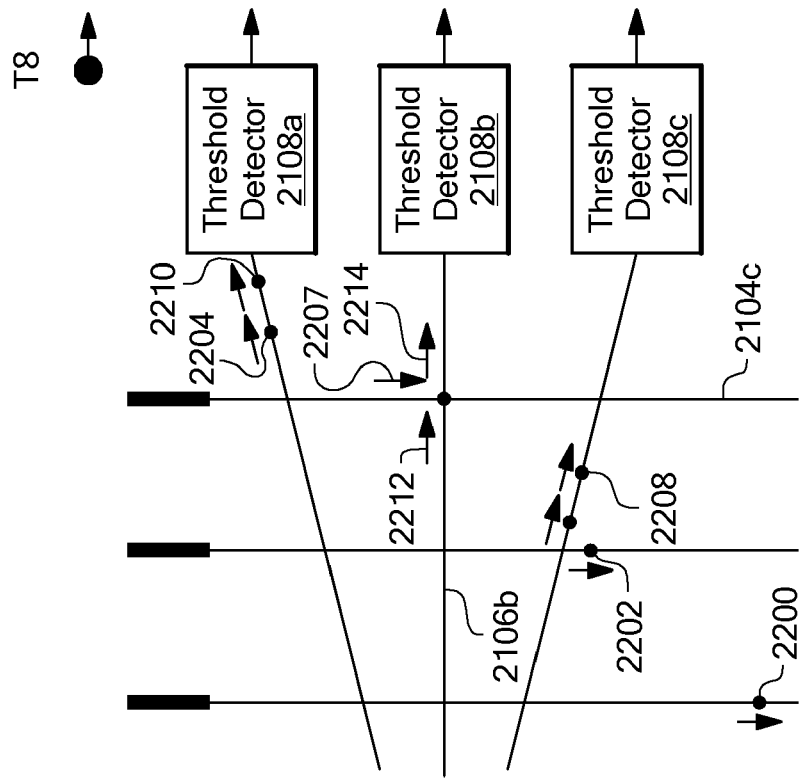
Figure 22G:
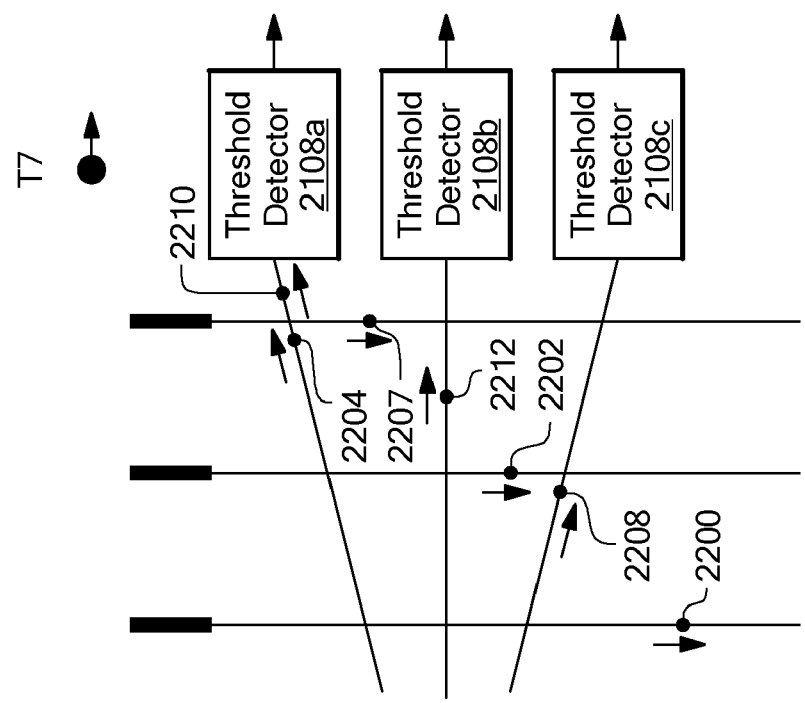

At time T7, the signals traveling along the various lines are as shown in FIG. 22*g*.

At time T8, as shown in FIG. 22*h*, the signal 2212 traveling along signal pickup line 2106*b* reaches the intersection with signal distribution line 2104*c* at the same time that signal 2207 traveling down signal distribution line 2104*c* reaches the intersection. The signal enforcement point at the intersection sums the two signals 2212 and 2207 and sends a summed signal 2214 along the signal pickup line 2106*b*.

As can be seen from FIGS. 22*a*-*h*, the only one of the signal pickup lines 2106 on which a doubly-summed signal reaches one of the threshold detectors 2108 is signal pickup line 2106*b*. That is, the signal 2214 triggers the threshold detector 2108*b* to produce an output signal, but none of the other threshold detectors 2108*a* or 2108*b* is triggered to produce output signals. Thus, signal pickup line 2106*b* triggers threshold detector 2108*b*, because the sensors 2100 detected an object moving at a particular speed.

Figure 23:
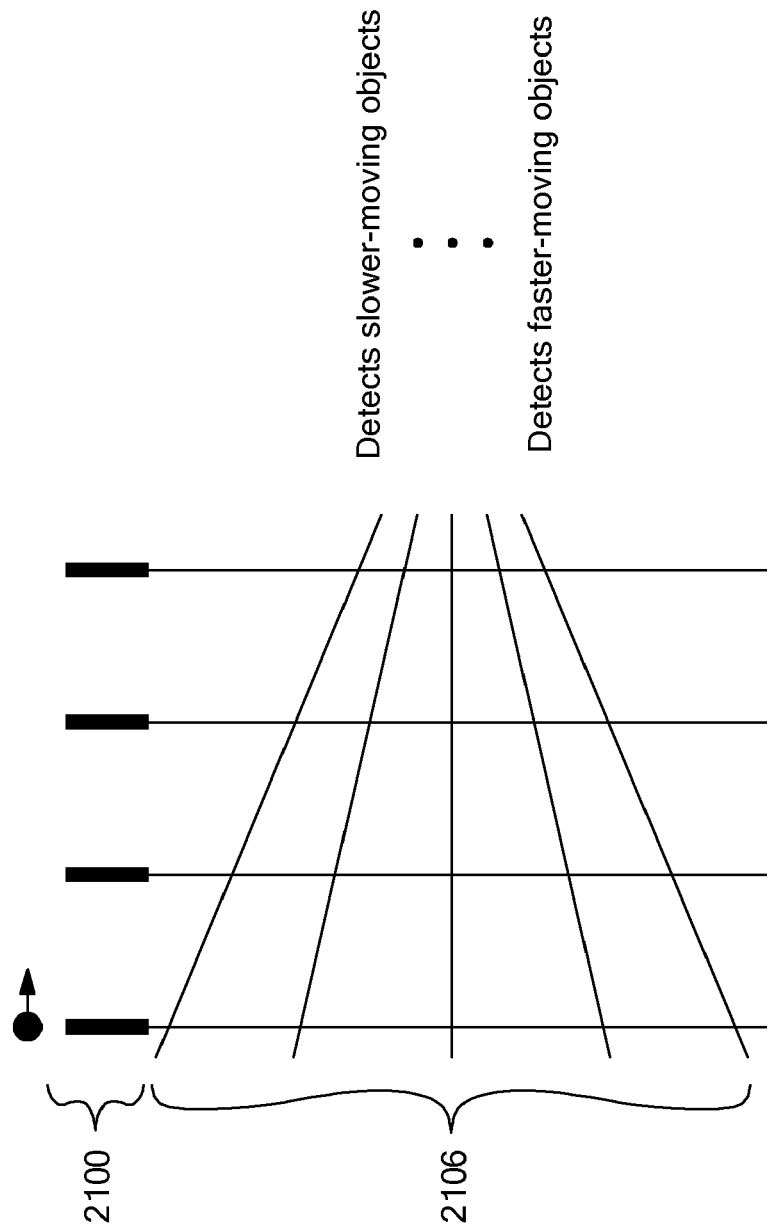
FIGS. 23 and 24 are schematic diagrams of other embodiments of the moving-object detector of FIG. 21.
Figure 24:
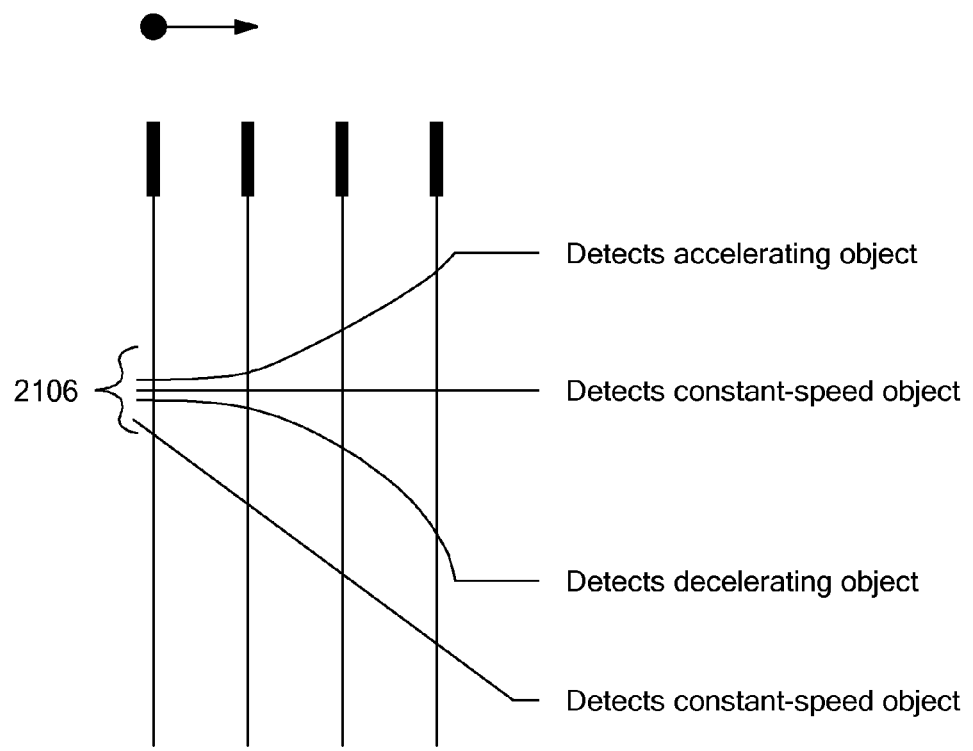

As can be seen from FIGS. 22*a*-*h* and FIG. 23, signal pickup lines 2106 having other angles trigger their respective threshold detectors 2108 if the sensors 2100 detect an object moving at other speeds. In particular, as shown in FIG. 23, signal pickup lines 2106 that are sloped toward the sensors 2100 detector faster moving objects, and signal pickup lines that are sloped away from the sensors detect slower moving objects. As shown in FIG. 24, curved signal pickup lines 2106 are used to detect accelerating or decelerating objects, while straight signal pickup lines are used to detect objects traveling at a constant speed.

Figure 25:
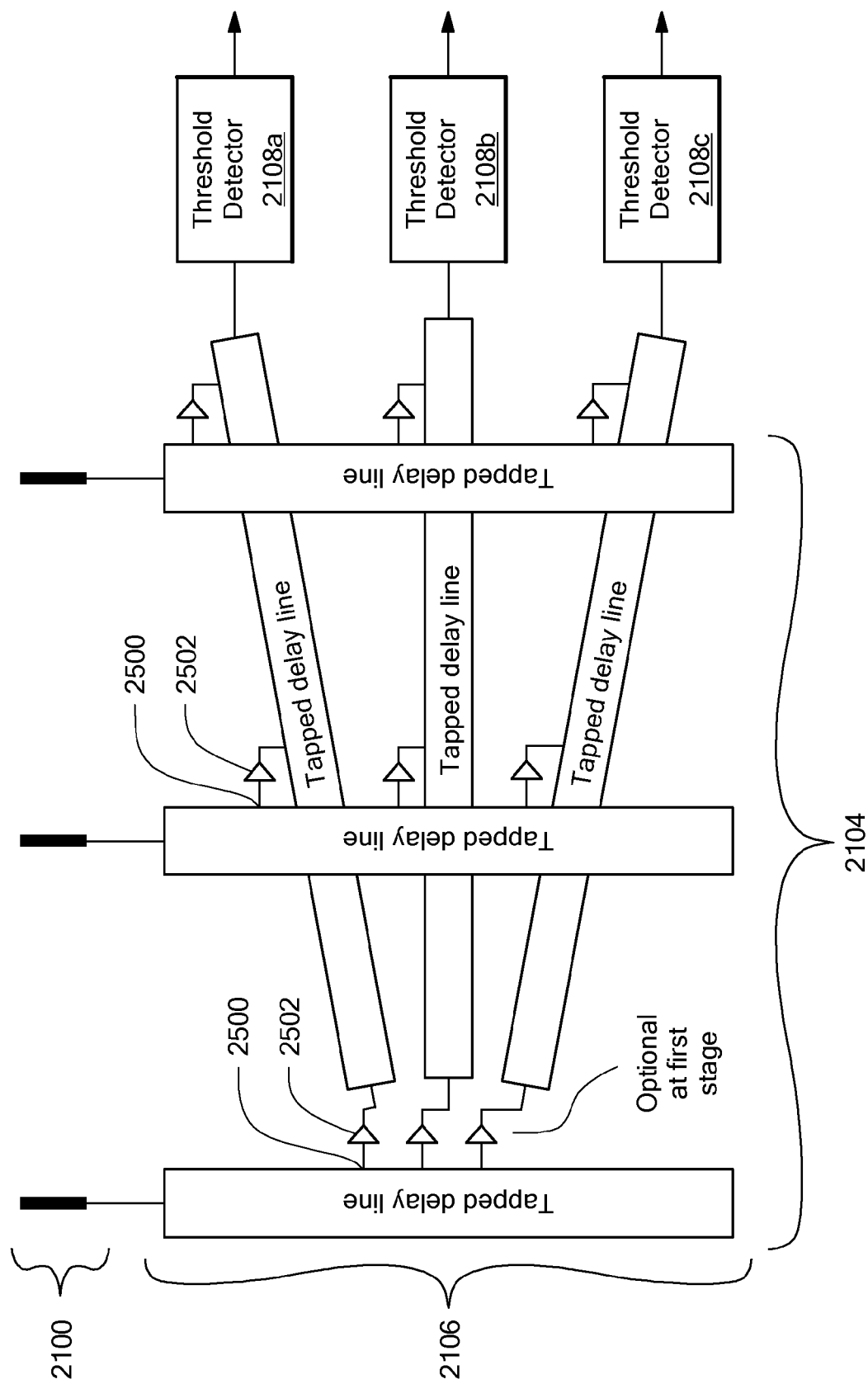
FIGS. 25-28 are schematic block diagrams of various implementations of the moving-object detector of FIG. 21.

As noted, the signal distribution lines 2104 and the signal pickup lines 2106 are delay lines. These delay lines can be implemented in various ways. For example, FIG. 25 shows an embodiment that includes tapped analog delay lines. The delay lines include a tap, such as those indicated at 2500, at each signal enforcement point. Each signal enforcement point also includes an amplifier, such as those indicated at 2502, to introduce a signal into a respective signal pickup line when a signal is detected at the corresponding tap on the signal distribution line.

In some alternative embodiments, the delay lines 2104 and 2106 shown in FIG. 25 are digital delay lines. In this case, buffers or adders can be used in place of amplifiers 2502. In some such embodiments, a single pulse is sent down each signal distribution line 2104 when the corresponding sensor 2100 detects an object. In these cases, adders 2502 insert the pulses detected at each tap of the signal distribution lines 2104 into the corresponding taps of the signal pickup lines 2106.

In other such embodiments, each delay line 2104 and 2106 includes a plurality of parallel digital delay lines, each carrying one bit of a multi-bit binary number. In such embodiments, when the corresponding sensor 2100 detects a change in contrast, a binary number representing the magnitude of the change or the magnitude of the detected flux or another number calculated by the sensor is sent down the corresponding signal distribution line 2104 as a set of parallel bits. In this case, adders 2502 insert the binary numbers detected at each tap of the signal distribution lines 2104 into the corresponding taps of the signal pickup lines 2106 or add these numbers to binary numbers coincidentally detected at the taps of the signal pickup lines.

In yet other embodiments, the signal distribution lines 2104 are single-bit lines, and the signal pickup lines 2106 are multi-bit lines, and the adders 2502 simply increment the multi-bit numbers detected at the taps of the signal pickup lines.

Appropriate analog and digital delay lines are readily available. For example, tapped Logic Buffered Delay Modules are available from Rhombus Industries, Inc., Huntington, Calif. Delay lines are also available from Engineered Components Co., St. Louis Obispo, Calif. In addition, variable delay lines are available, such as from Data Delay Devices, Inc., Clifton, N.J. These delay lines can be adjusted mechanically, by varying an applied voltage or by parallel or serial programming. Thus, the signal distribution lines 2104 and the signal pickup lines 2106 can be constructed by connecting one or more commercially available delay lines in series. Furthermore, variable delay lines can be used, and the delays can be dynamically selected to correspond to the type of information that is sought.

Figure 26:
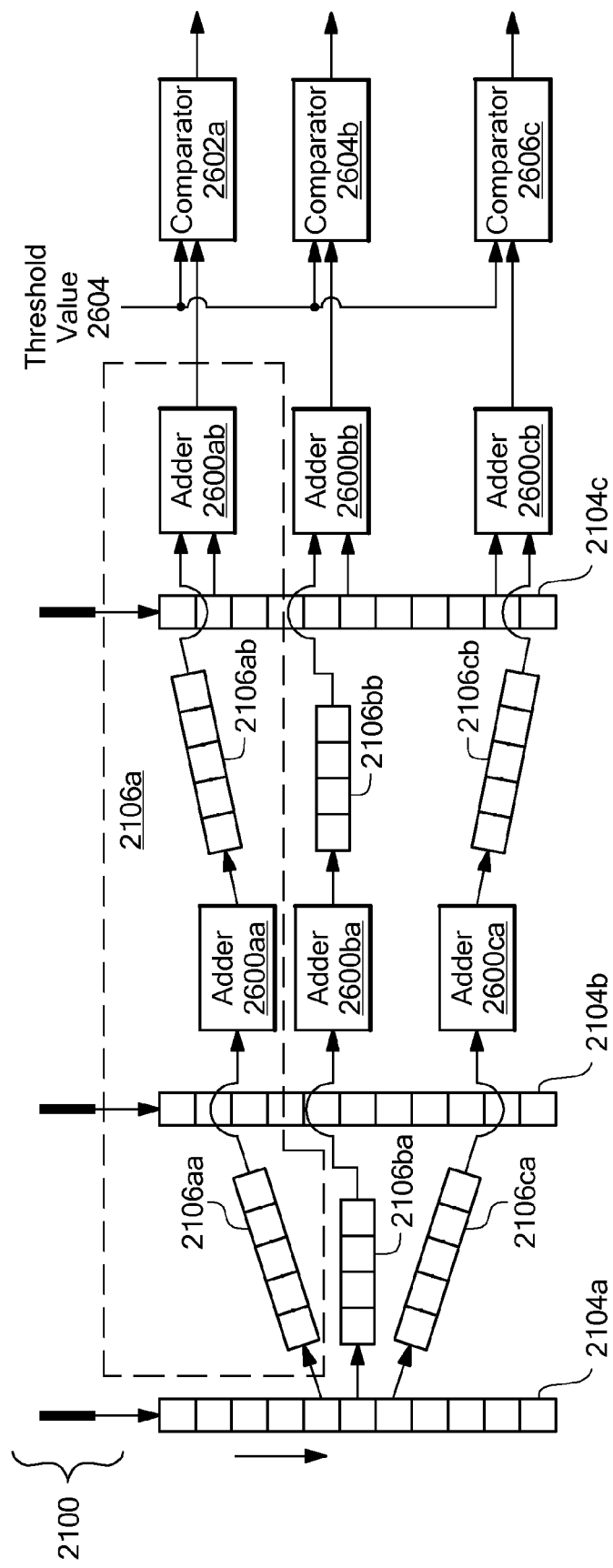

In yet another group of alternative embodiments exemplified in FIG. 26, the delay lines can be constructed from tapped shift registers that are all clocked together, so data moves through all the shift registers in lock step. The number of shift register stages between taps controls the relative delay of the signals between the taps. In one such embodiment, the signal distribution lines 2106*a*-*c* are one-bit-wide shift registers. Each sensor 2100 sends a binary (yes/no) signal indicating whether the sensor detected an object. The signal distribution lines 2104*a*-*c* progressively shift the binary signals from the sensors 2100 down the signal distribution lines. In another such embodiment, the signal distribution lines 2104*a*-*c* are multi-bit-wide shift registers. In this embodiment, each sensor 2100 sends a multi-bit value, such as the magnitude of flux detected by the sensor or a logarithm thereof, and the signal distribution lines 2104a-c progressively shift the binary values down the signal distribution lines.

Each signal pickup line 2106 includes a number of shift registers segments, such as segments 2106aa and 2106ab, connected essentially in series. For example, signal pickup line 2104a includes two segments, namely 2106aa and 2106ab. At each cross point where a signal distribution line 2104 crosses a signal pickup line 2106, an adder 2600 adds the value from the signal distribution line 2104 shift register stage at the cross point to the signal pickup line 2106 shift register. For example, adder 2600aa has two inputs. One input is connected to signal pickup line 2106a, in particular, to the output stage of shift register segment 2106aa. The other input is connected to signal distribution line 2104b, in particular, the stage of the signal distribution line at which the signal pickup line 2106a crosses the signal distribution line. The output of the adder 2600aa feeds an input of the next shift register stage 2106ab of the signal pickup line 2106a.

The output of the final adder 2600ab of the signal pickup line 2104a feeds a comparator 2602a. The comparator 2602a compares the output of the adder 2600ab to a threshold value 2604. If the output of the adder 2600ab is at least equal to the threshold value 2604, the comparator 2602a outputs a signal.

A set of signal distribution lines 2104 and an intersecting set of signal pickup lines 2106 can be implemented in software. For example, software can model the shift register implementation described with respect to FIG. 26. Given the teachings herein, other software implementations are well within the skill of an ordinary practitioner.

Figure 27:
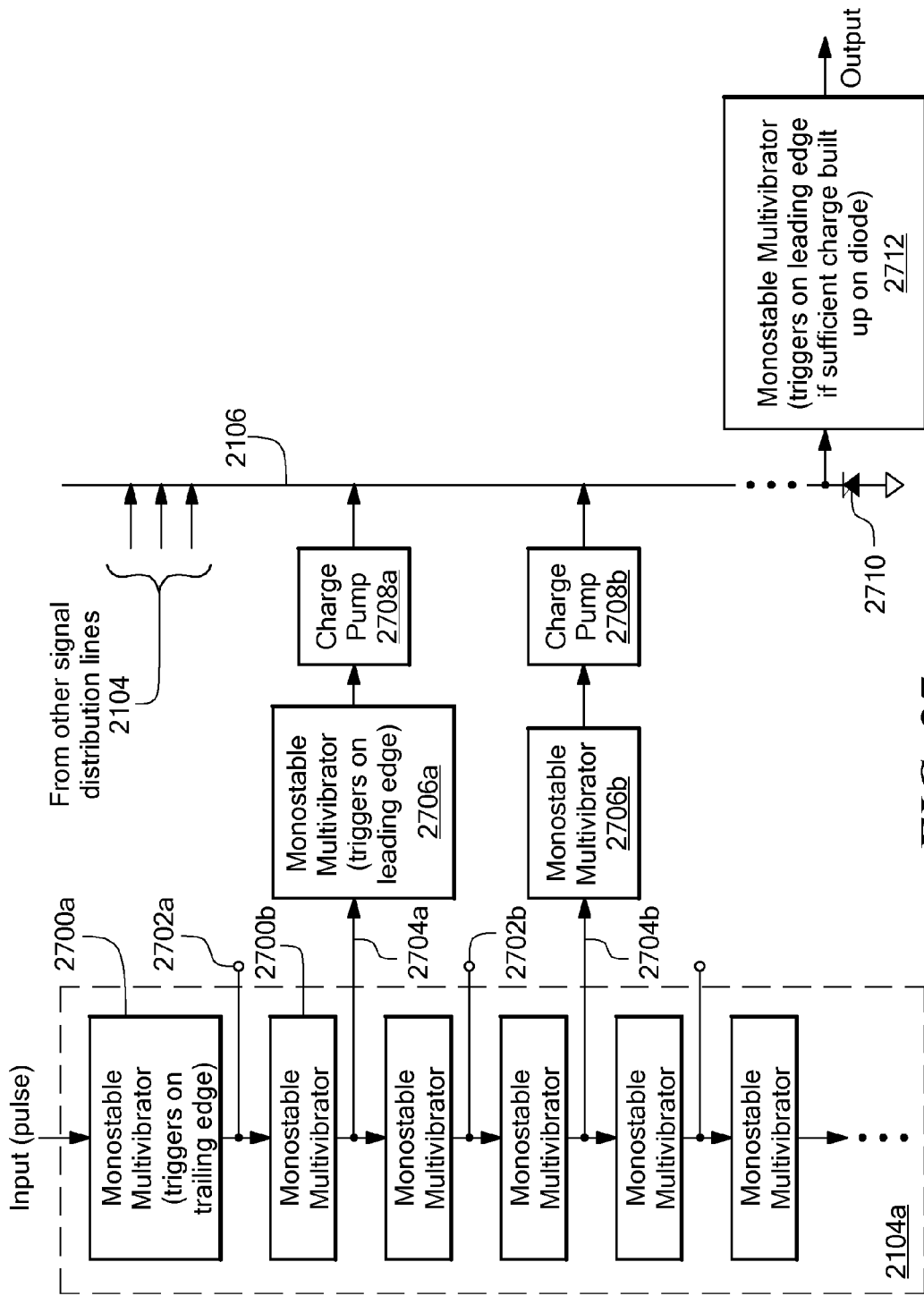

Yet another alternative embodiment of a shaped motion detector is shown schematically in FIG. 27. In this embodiment, when a sensor (not shown) detects an object, a pulse is delivered to a signal distribution line 2104. Each signal distribution tapped delay line 2104 is constructed of a set of trailing-edge-triggered, monostable multivibrators 2700 connected in series, as shown at 2106a. The taps 2702 are taken between each pair of adjacent monostable multivibrators 2700.

At taps 2704 where signals are to be taken from a signal distribution line 2104 and added to a signal pickup line 2106, the signal from the signal distribution line is sent to a leading-edge-triggered, monostable multivibrator 2706. The monostable multivibrator 2706 generates a pulse, which drives a charge pump 2708. The charge pump 2708 injects a charge into the signal pickup line 2106. As the pulse from the sensor travels down the signal distribution line 2104a, additional monostable multivibrators 2706 are triggered, and additional charges are pumped into the signal pickup line 2106. These charges accumulate on a diode 2710.

Other signal distribution lines 2104 (not shown) are driven by other sensors (not shown) to inject charges into the signal pickup line 2106 as the object is detected by these other sensors, as described above with respect to FIGS. 21-26.

Charges injected as a result of pulses traveling down the respective signal distribution lines 2104 accumulate on the diode 2710. The diode 2710 slowly leaks these charges to ground. However, over a short period of time, i.e. before the diode leaks a significant amount of this charge to ground, the charge built up on the diode is proportional to the number of charge injections onto the signal pickup line 2106. That is, the charge built up on the diode 2710 is linearly proportional to the number of sensors that detected an object moving at a particular speed. The voltage on the diode 2710 is exponentially proportional to this charge.

If a sufficient number of these charges are pumped into the signal pickup line 2106 over a predetermined period of time, i.e. before the diode leaks these charges to ground, the charge on the diode is sufficient to trigger a monostable multivibrator 2712, which generates an output signal indicating that an object moving at the predetermined speed was detected. Optionally, the output signal cause the diode 2710 to immediately drain all remaining charge (not shown).

Alternatively, the diode 2710 can be replaced by a capacitor and a drain resistor in parallel with the capacitor, or another functionally equivalent circuit. Optionally, the signal distribution lines 2104 can include a capacitor in the series connection between each pair of adjacent monostable multivibrators.

Figures 28, 29:
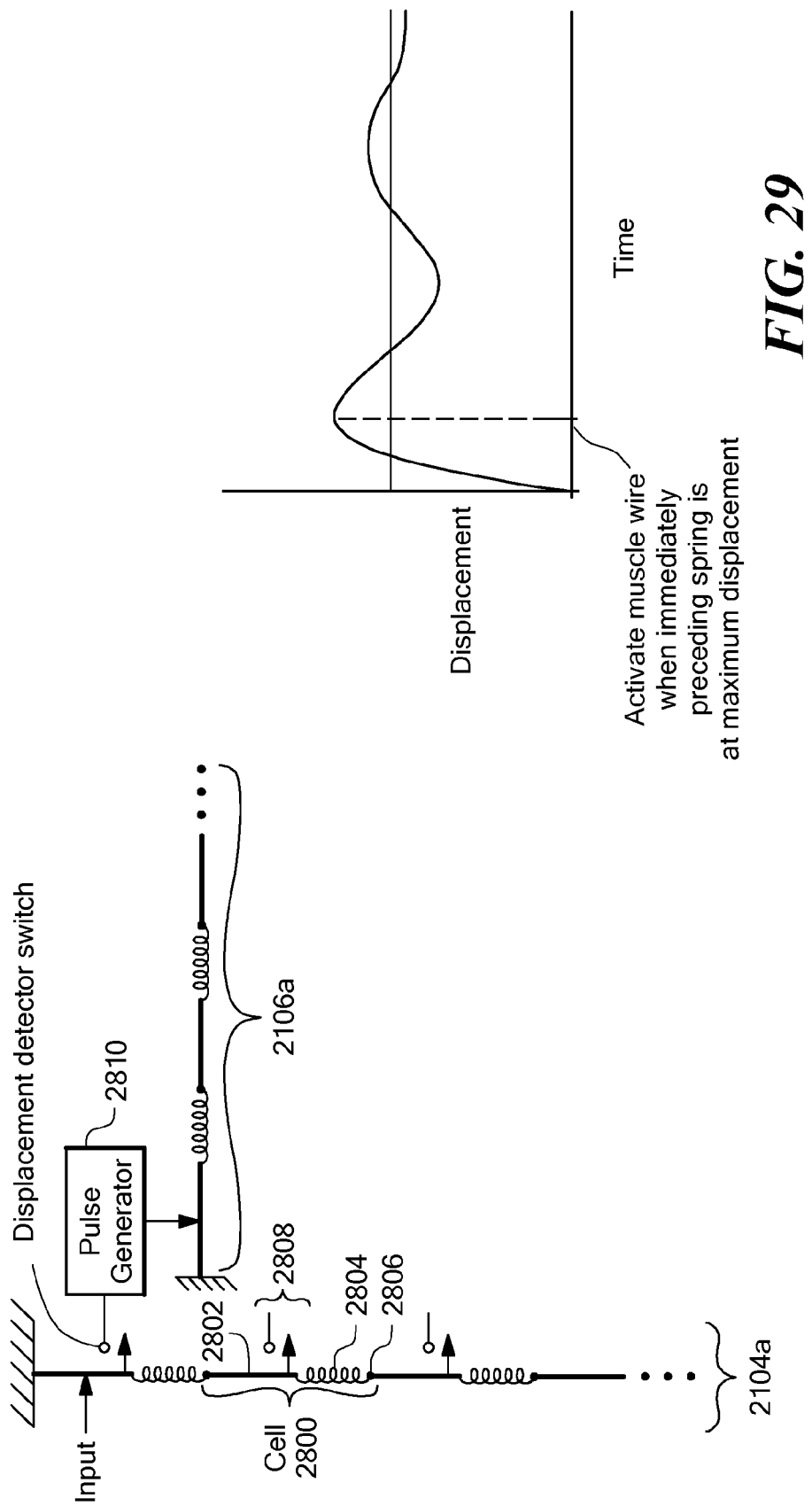
FIG. 29 is a graph depicting displacement of a component of the implementation of the moving-object detector shown in FIG. 28.

FIG. 28 illustrates yet another alternative embodiment, in which mechanical elements are used to implement signal distribution delay lines and signal pickup delay lines. A signal distribution line is constructed of a series of cells, such as cell 2800. Each cell is analogous to a stage of a shift register, and a signal can be tapped from any cell along the length of the delay line.

Each cell includes a length of muscle wire 2802, a spring 2804 and a mass 2806. Muscle wire contracts when stimulated by an electrical signal. The muscle wire 2802, the spring 2804 and the mass 2806 are selected such that, when stimulated by a pulse, the muscle wire contracts and rings, i.e. the contraction overshoots and the cell is underdamped. FIG. 29 shows a graph of the displacement of the muscle wire after it has been stimulated by a pulse.

Returning to FIG. 28, each cell also includes a switch 2808 that detects if the muscle wire 2802 has been displaced by at least a unit amount. If a sensor (not shown) detects an object, the sensor injects a pulse that stimulates the first cell of the signal distribution line 2104. At each point where a signal pickup line 2106 crosses a signal distribution line 2104, the output of the switch 2808 is connected to a pulse generator 2810, which generates a pulse that stimulates the cell in the signal pickup line 2106.

Velocity-Independent Motion Detection

Signal distribution trees and signal pickup units can also be shaped and configured to detect object moving within a wide range of speeds, essentially by adding or logically ORing together the outputs of a plurality of variously-sloped signal pickup lines. Such an embodiment identifies where a moving object will be, based on its velocity history. Each of the signal pickup lines detects object moving at speeds within a relatively narrow range. If a plurality of variously-sloped signal pickup lines having overlapping speed ranges is used, the combination of these signal pickup lines can detect objects moving at any speed within a range equivalent to the concatenation of all the overlapping speed ranges. An example of such a configuration is showed in FIG. 30.

A plurality of variously-sloped signal pickup lines 2106 converge in a summer 3000. If the object 2102 is moving at a speed that is within the speed range that corresponds to one of the signal pickup lines 2106, that signal pickup line produces a signal sufficient to trigger the threshold detector 2108. If the object 2102 accelerates or decelerates while traveling within the field of view of the sensors 2100, a combination of signals produced by a combination of the signal pickup lines 2106 are summed by the summer 3000. That is, during the time the object 2102 travels within a first speed range, one of the signal pickup lines 2106 produces signals, albeit likely insufficient to trigger the threshold detector 2108. During the time the object 2102 travels within a second speed range, another one of the signal pickup lines 2106 produces signals, albeit also likely insufficient to trigger the threshold detector 2108. The summer 3000 adds the signals produced by the first and the second signal pickup lines 2106. This sum is likely to be sufficient to trigger the threshold detector 2108.

Figure 30:
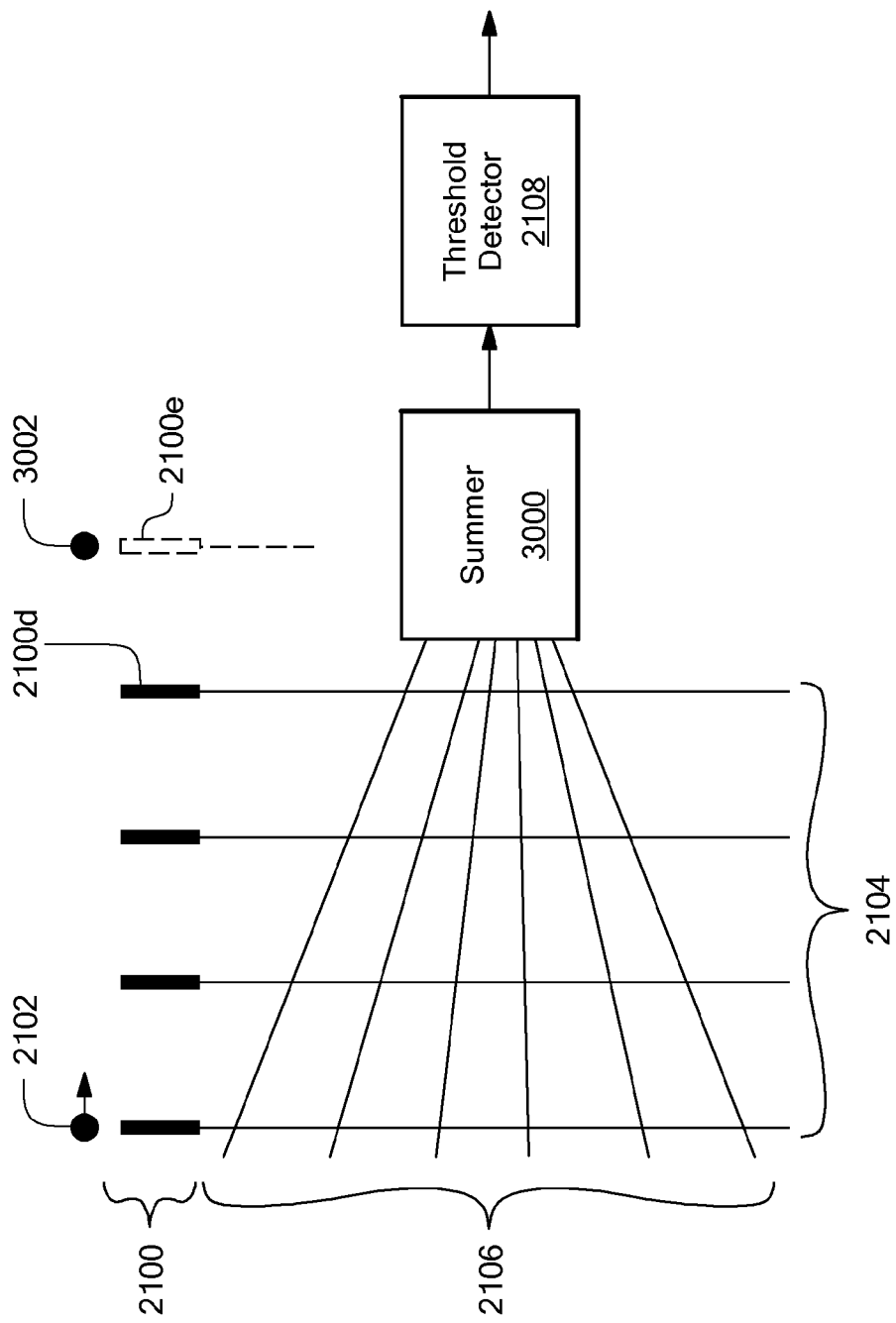
FIG. 30 is a schematic diagram of a velocity-independent motion detector.

The threshold detector 2108 produces an output signal when the object 2102 reaches the last sensor 2100*d* or a position beyond the last sensor. For example, the threshold detector 2108 can produce an output signal when the object 2102 reaches a position 3002 where a next sensor (shown in phantom at 2100*e*) would be located. Thus, the embodiment depicted in FIG. 30 is capable of detecting an object moving at a variety of speeds, even if the object accelerates or decelerates.

NTSC-to-HDTV Signal Conversion

As discussed above, with reference to FIGS. 9-14, a set of appropriately shaped signal distribution trees can be used with a set of appropriately shaped signal pickup units to convert a first signal having a first granularity or resolution to a second signal having a second (finer) granularity or resolution, a transform referred to herein as hyperacuity. In another example of hyperacuity, an embodiment of the presently disclosed system can convert a National Television System Committee (NTSC) television signal to a (higher resolution) High-Definition Television (HDTV) signal. Such an embodiment utilizes an array of hemispherical signal distribution trees, such as those described above with reference to FIG. 9, arranged in an array, such as the one shown in FIGS. 10 and 11. A pixelated NTSC television signal is fed to the array of signal distribution trees. Each NTSC pixel's value is sent as a signal to one of the signal distribution trees.

Figure 31:
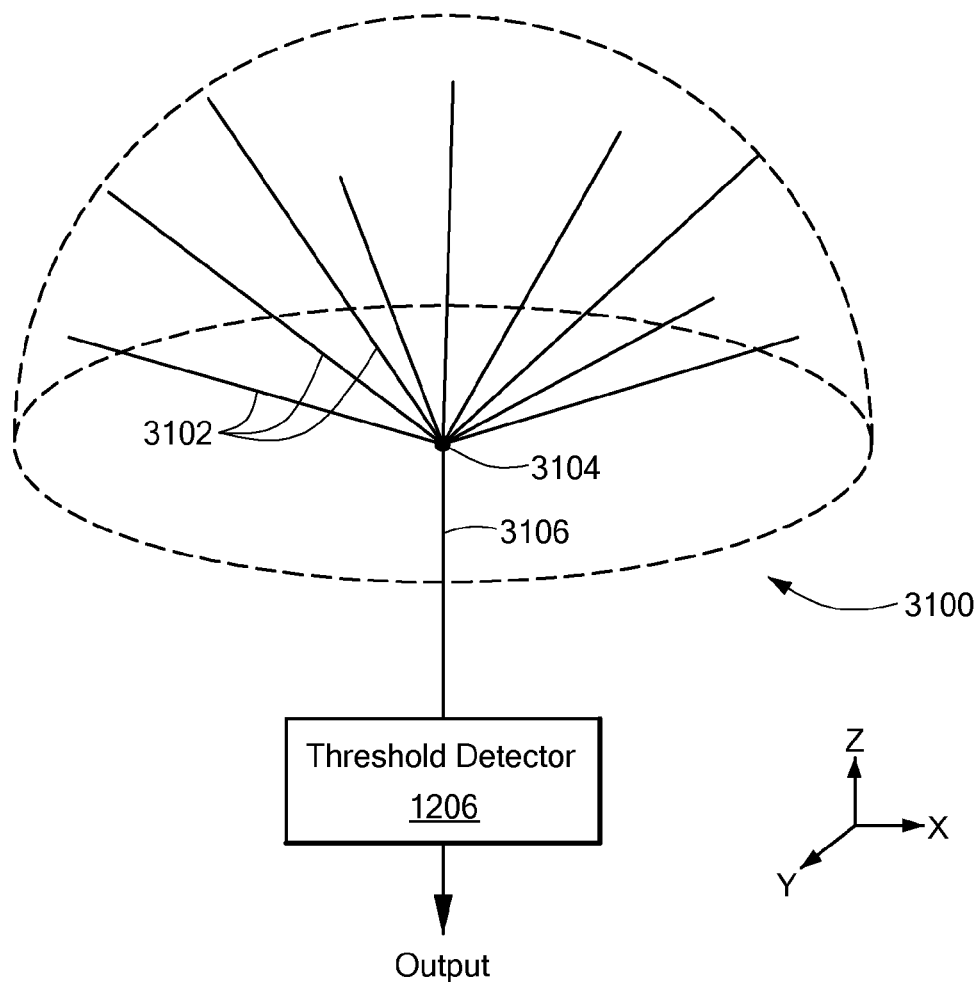
FIG. 31 is a schematic diagram of another signal pickup unit.

This embodiment utilizes hemispherical signal pickup units, such as the one depicted in FIG. 31 at 3100. The signal pickup unit 3100 is similar (but upside-down) to the signal distribution tree shown in FIG. 9. For example, the signal pickup lines 3102 are oriented at random angles, relative to the signal output line 3106.

Figure 32:
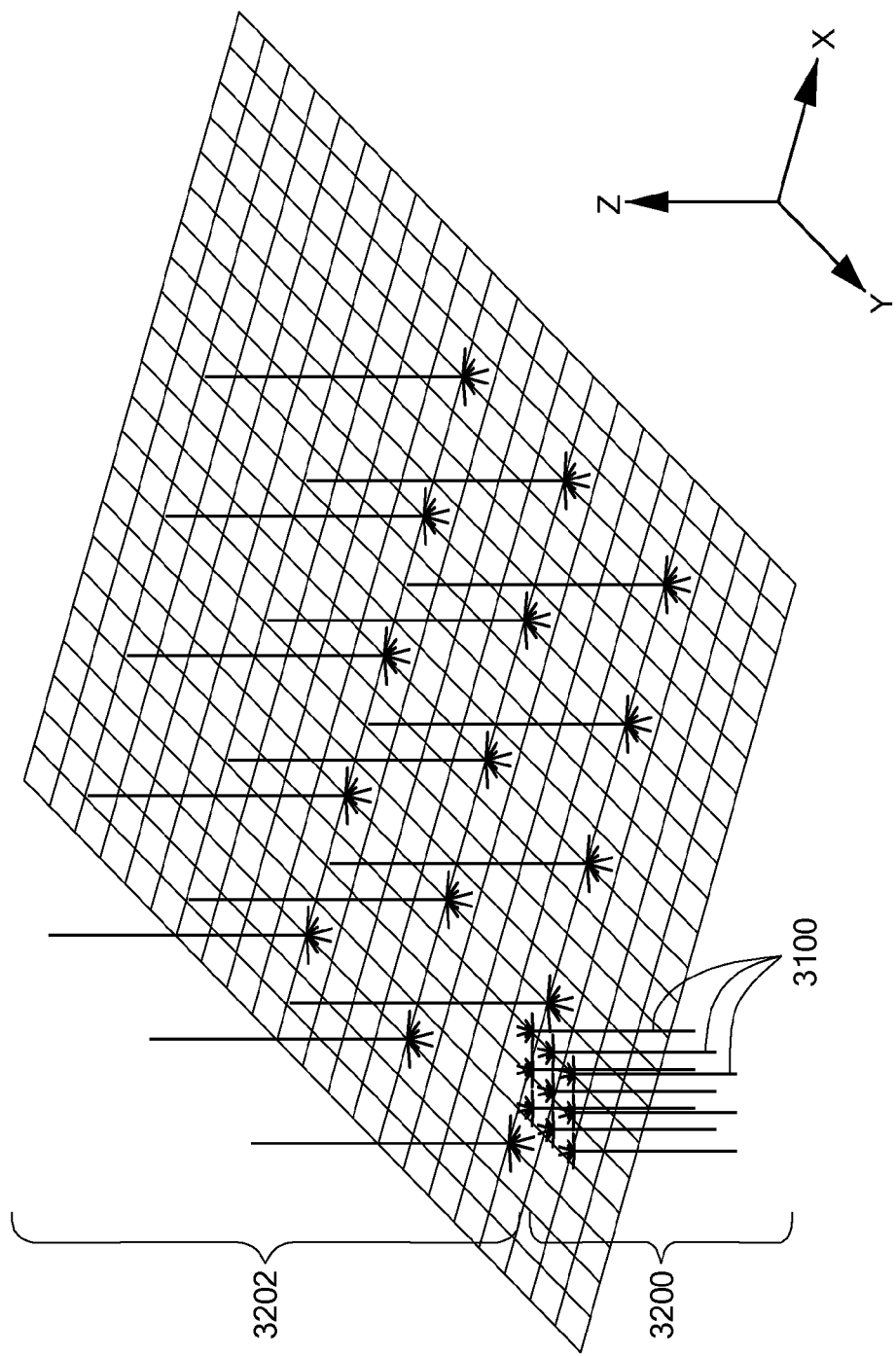
FIG. 32 is a perspective schematic diagram of a set of the signal pickup units of FIG. 31 interdigitated with the array of signal distribution trees the FIG. 10.

As shown in FIG. 32, an array 3200 of signal pickup units 3100 interdigitates with an array 3202 of signal distribution trees. For simplicity, as in FIGS. 10, 11 and 13, only a portion of each signal distribution line and each signal pickup line is shown in FIG. 32. Preferably, the signal pickup unit 3100 includes more signal pickup lines 3102 than the signal distribution tree 900 includes signal distribution lines 906.

Unlike the signal pickup unit 1200 described above with respect to FIG. 12, the signal pickup lines 3102 of the signal pickup unit 3100 are delay lines. As in the velocity-independent motion detector shown in FIG. 30, each signal pickup line 3102 can connect to a plurality of signal distribution lines in the array 3202 of signal distribution trees. In addition, each signal pickup unit 3100 includes a summer 3104 to sum the signals arriving on the signal pickup lines 3102 of the signal pickup unit.

Figure 33:
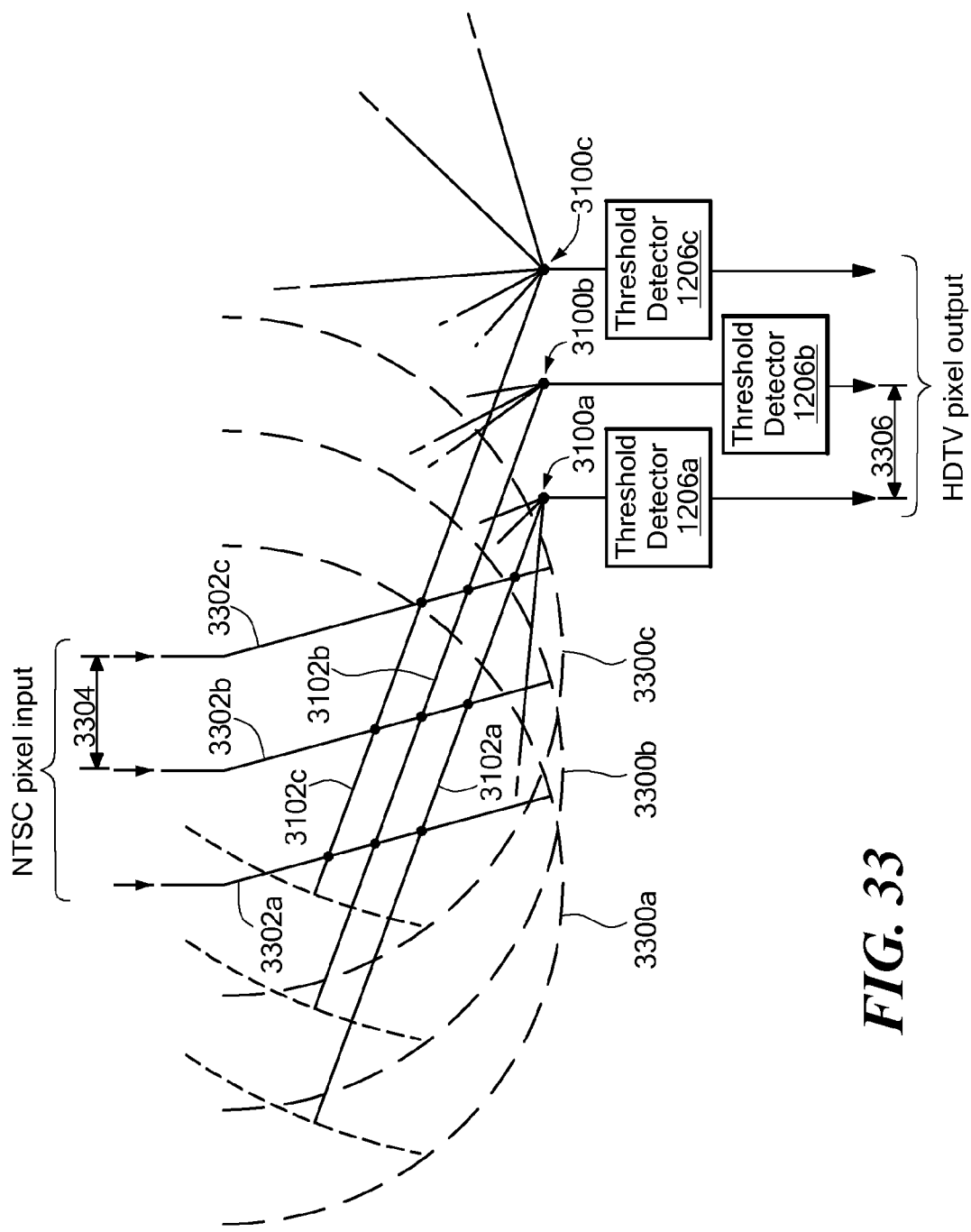
FIG. 33 is a detailed schematic diagram (side view) of a portion of the complex shown in FIG. 32.

FIG. 33 is similar to FIG. 14, in that FIG. 33 shows the interconnection of three signal pickup units 3100*a-c* with three signal distribution trees 3300*a-c*. As discussed with reference to the velocity-independent motion detector of FIG. 30, each signal pickup line 3102 interconnects with a plurality of signal distribution lines 3302. Thus, each signal pickup unit 3100 detects a moving point in the pixelated NTSC picture. To provide the hyperacuity, the density of signal pickup units 3100 in the array 3200 is greater than the density of signal distribution trees in the array 3202. That is, the distance 3304 between adjacent NTSC pixels is greater than the distance between adjacent signals produced by the threshold detectors 1206. Each of the threshold detectors 1206 represents a pixel in the HDTV picture. Consequently, the resolution of the resultant HDTV picture is greater than the resolution of the pixelated NTSC picture.

In general, the number or density of signal distribution trees corresponds to the number of pixels or resolution of an input signal, and the number or density of signal pickup units corresponds to the number of pixels or resolution of a desired output signal.

Because of the symmetry of the signal distribution trees and the signal pickup units, this embodiment can be operated in reverse to produce a lower-definition signal from a higher-definition signal.

Other Shapes of Signal Distribution Trees and Signal Pickup Units

Figure 34:
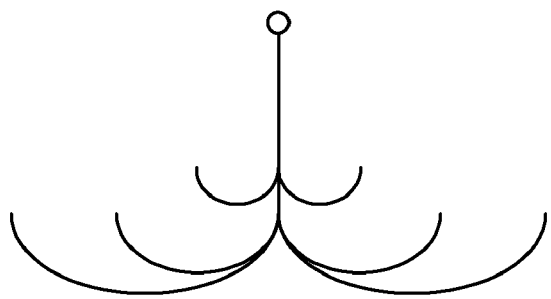
FIG. 34 is an illustration of four exemplary shapes of signal distribution trees and signal pickup units.
Figure 34:
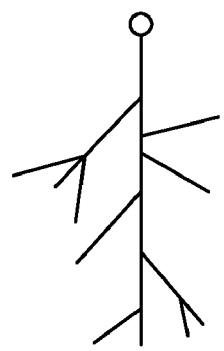
Figure 34:
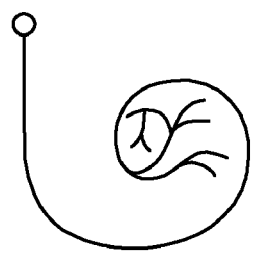
Figure 34:
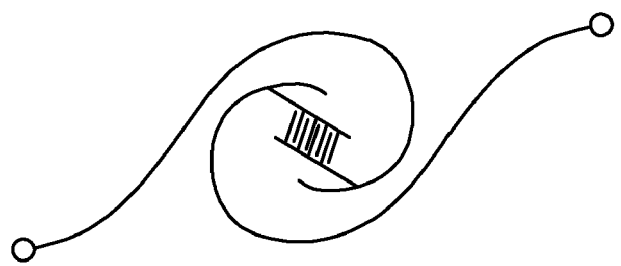

Other shapes of signal distribution trees and signal pickup units can be used to perform other functions and transforms. Shapes are not dedicated to either signal distribution or signal pickup purposes. That is, any shape can be used for signal distribution or signal pickup. Some of the shapes, such as the signal distribution tree of FIG. 9 and the signal pickup units of FIGS. 12 and 31, are three-dimensional shapes. Other shapes can be two-dimensional, i.e. planar. Some of the planar shapes can be rotated about an axis to produce three-dimensional shapes. For example, a signal pickup unit similar to the one depicted in FIG. 12 can be produced by rotating a fork about its axis. The resulting shape is referred to herein as a "rosette." Some exemplary shapes of signal distribution trees and signal pickup units are shown in FIG. 34.

The signal distribution trees and signal pickup trees described above, such as with respect to FIGS. 9 and 31, are simple radial trees. That is, they have one or more branches radiating from a central point, and the tree ends at the ends of these branches. Alternatively, these trees can be bifurcated (branching) trees. That is, one or more branches radiate from the central point, and at least some of these branches fork. Optionally, some of the tines of the forks also fork, etc.

Color Designation, Regardless of Illumination

Figure 36:
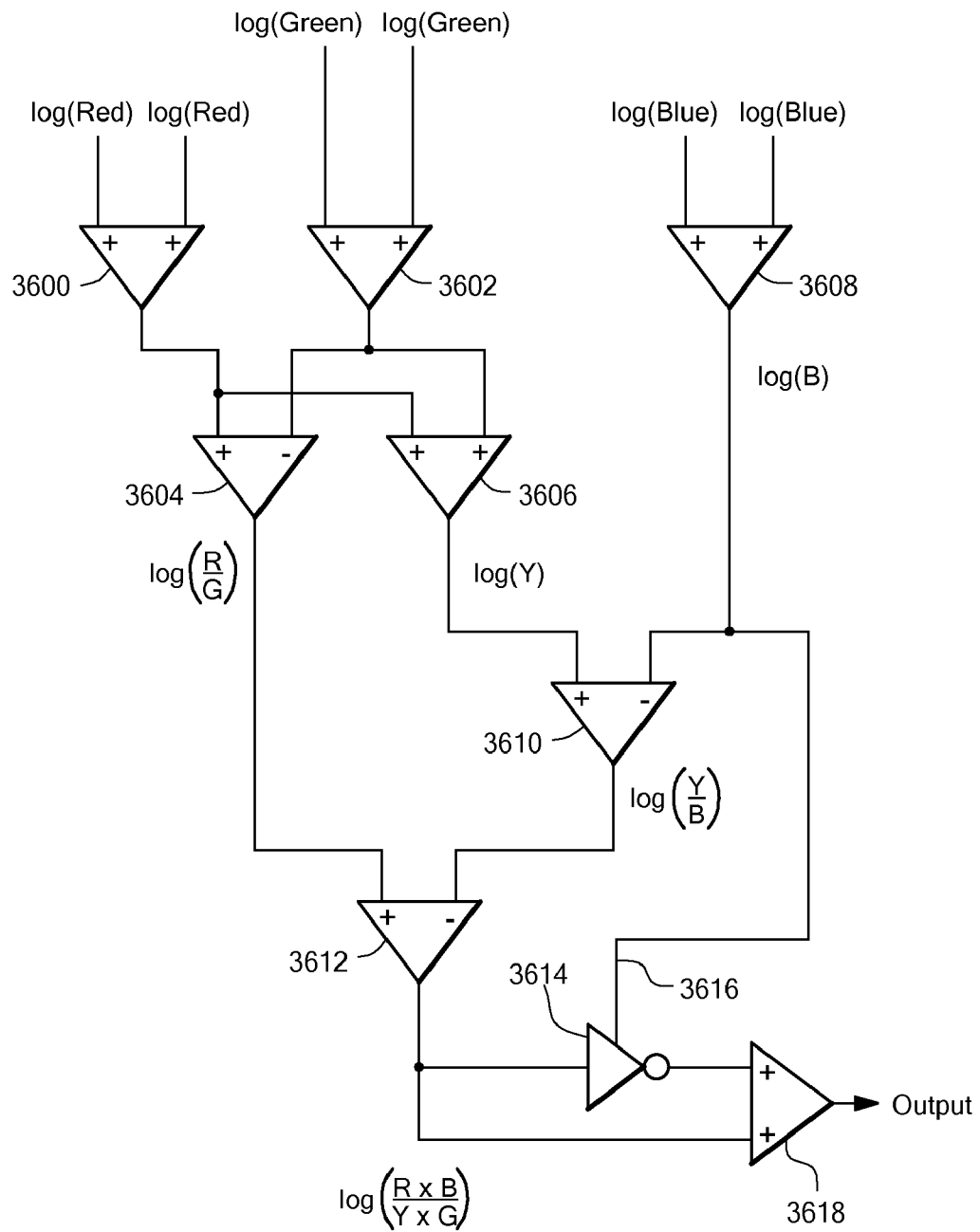
FIG. 36 is a schematic diagram of a circuit for designating color, regardless of illumination.

Many vision systems operate under varying lighting conditions. It would be advantageous for such systems to be able to ascertain colors accurately and consistently, without regard to the amount of illumination in a scene. The circuit shown in FIG. 36 enables such color designation, regardless of illumination. The electrical current flowing through a photodetector is proportional to the flux impinging on the photodetector. The voltage across a photodetector is proportional to the logarithm of the flux impinging on the photodetector. Signals from one or more red-sensitive sensors are added together by an adder 3600 to produce a signal representative of the average voltage across the red-sensitive sensors, i.e. the logarithm of the flux impinging on the red-sensitive sensors. Similarly, the logarithm of the flux impinging on green-sensitive sensors is computed by a second adder 3602. A third adder 3604 calculates a difference between the signals produced by the first and the second adders. The third adder 3604 thus produces a signal equal to log(R/G), where R represents the red flux and G represents the green flux.

A fourth adder 3606 and the signals from the first and the second adders to produce a signal equal to log(Y), where Y represents the yellow flux.

A fifth adder 3608 calculates the logarithm of the flux impinging on blue-sensitive sensors. A sixth adder 3610 computes a difference between log(Y) and log(B), where B represents the blue flux. This difference is equal to log(Y/B).

Figure 37:
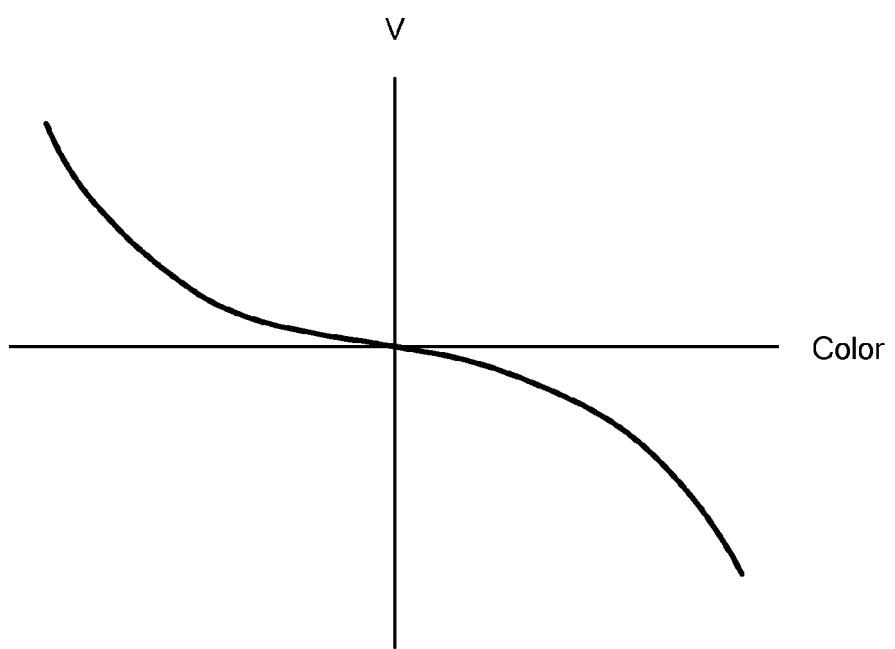
FIG. 37 is a plot of voltage-versus-wavelength of the circuit of FIG. 36.

A seventh adder 3612 calculates a difference between log (R/G) and log(Y/B). This difference is equal to log((R*B)/ (Y*G)), where "*" represents multiplication. This difference is fed into a variable-gain inverter 3614. The gain of the variable-gain inverter 3614 is controlled by a line 3616, which carries signal equal to log(B). (Alternatively, the variable-gain inverter 3614 is controlled by the output of summer 3600.) The output of the variable-gain inverter 3614 and the output of the seventh after 3612 are summed by an eight adder 3618 to produce an output signal. The graph in FIG. 37 depicts a characteristic voltage-versus-color plot of the output signal. Thus, this embodiment generates specific voltages in response to detecting specific colors, regardless of the level, spectral distribution, color temperature, etc. of the ambient illumination.

Muscle Wire/Spring Complex

Figure 38:
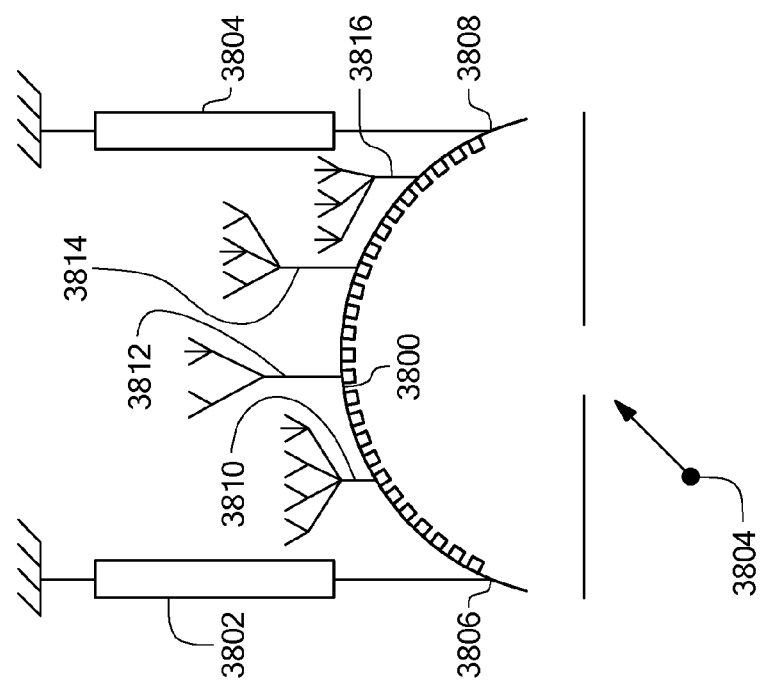
FIG. 38 is a schematic diagram of a sensor orientation mechanism.

Signal processing systems, such as those described herein, can identify points and objects and can transform signals, among other things. Sometimes, it is advantageous to drive mechanical systems with the outputs of signal processing systems. For example, as shown in FIG. 38, a pivotally-mounted sensor surface 3800 contains an array of sensors. Two mechanical actuators 3802 and 3804 are configured to move the sensor surface 3800 by applying relative amounts of tension at points 3806 and 3808 on the sensor surface, thereby pivoting the sensor surface and orienting it toward a desired point in the field of view.

Figure 39:
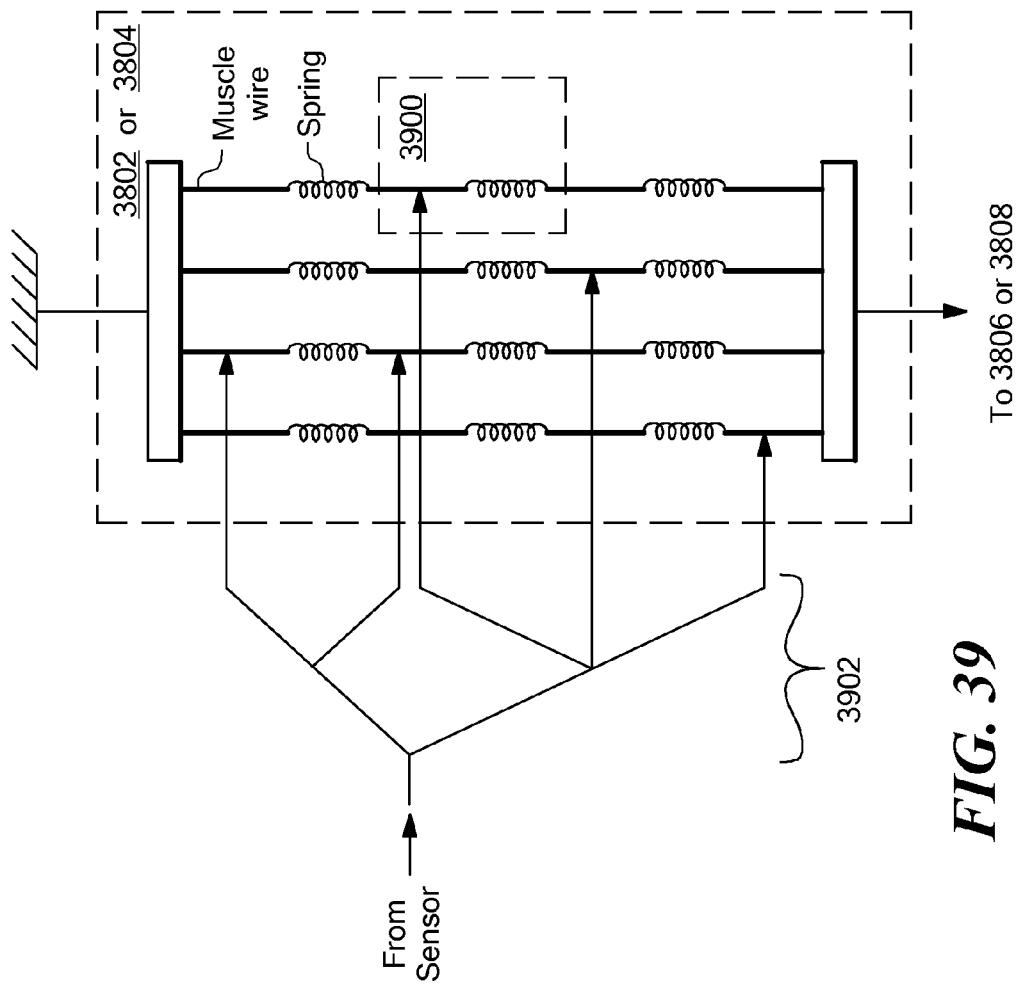
FIG. 39 is a schematic diagram of mechanical actuator and signal distribution tree of the mechanism of FIG. 38.

Each mechanical actuator 3802 and 3804 includes a plurality of muscle wire/spring groups, such as group 3900, as shown in FIG. 39. A plurality of these groups are connected together in series to form a series combination. A plurality of these series combinations are ganged together in parallel to form the mechanical actuator. One end of the gang is connected to one of the points 3806 or 3808 on the sensor surface 3800, and the other end of the gang is connected to a solid point. The tension generated by the mechanical actuators 3802 and 3804 depend on the number of muscle wires that are stimulated in each of the mechanical actuators. Thus, if one of the mechanical actuators is producing more tension than the other mechanical actuator, the sensor surface 3800 is pivoted, and thereby oriented, toward the direction of the greater tension.

Each sensor is connected to a respective signal distribution tree, examples of which are shown at 3810, 3812, 3814 and 3816. Each tree distributes signals from its respective sensor to the tree's leaf nodes. Each leaf node is connected to one of the muscle wires, and each muscle wire is connected to one leaf node. One exemplary signal distribution tree a shown at 3902.

As previously noted, if a muscle wire is stimulated with an electrical pulse, the muscle wire contracts. Muscle wires cannot, however, be repeatedly stimulated without a recovery period after each stimulation. Each branch of each tree has an associated recovery time. If a branch passes a signal, the branch will not pass a subsequent signal until the branch's associated recovery time has passed. The recovery times are randomly distributed among the branches, although branches closer to the muscle wires generally have longer recovery times than branches closer to a sensors. This ensures that a muscle wire is not stimulated while it is still in a recovery period.

Figure 40:
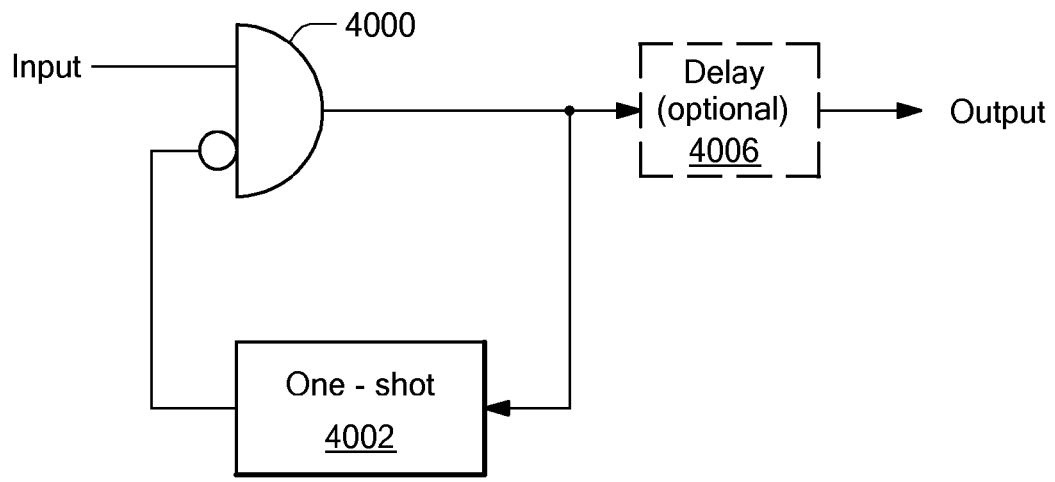
FIGS. 40 and 41 are schematic diagrams of two embodiments of recovery circuits used by the sensor orientation mechanism of FIG. 38.
Figure 41:
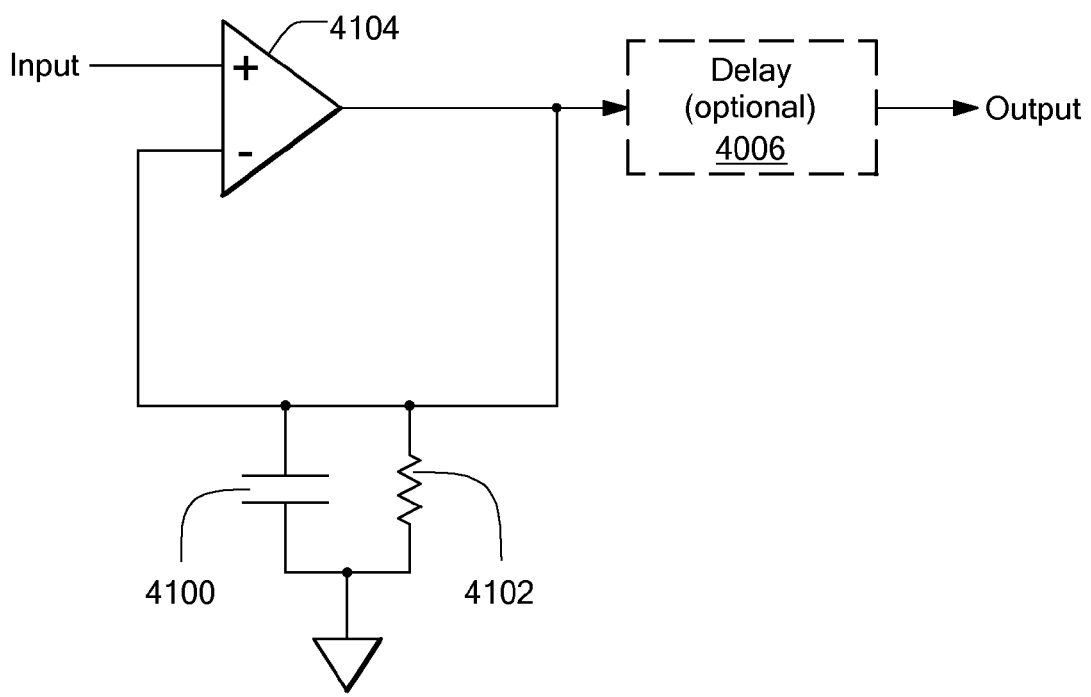

Two embodiments of recovery circuits are shown in FIGS. 40 and 41, respectively. In the circuit shown in FIG. 40, and input pulse is passed by an AND gate 4000 to an output, unless the AND gate is disabled. The output of the AND gate 4000 also triggers a one-shot 4002, which produces a time-delay pulse having a duration equal to the recovery time. This time-delay pulse is fed to an inverted input of the AND the 4000, thereby disabling the AND gate for the duration of the time-delay pulse.

The embodiment shown in FIG. 41 is an analog circuit that employs a capacitor 4100 and a resistor 4102 to generate the time-delay pulse, and the differential amplifier 4104 to selectively pass a pulse appearing on the input.

Both embodiments optionally include a delay line 4006.

Returning to FIGS. 38 and 39, if the sensor detects an object, the sensor sends a pulse into its signal distribution tree. However, some or all of the branches (i.e. the branches that are currently within their respective recovery times) do not pass the signal. Because the recovery times are randomly distributed among the branches, which leaf nodes (and thus which muscle wires) receive the signal cannot be predicted. Thus, the signal generated by the sensor reaches and stimulates a subset of the muscle wires that are connected to the sensor's signal distribution tree. Thus, each signal distribution tree statistically distributes pulses from its corresponding sensor to the associated muscle wires. Consequently, if a sensor generates pulses relatively more frequently, statistically more of these pulses reach the associated muscle wires, and the mechanical actuator pulls with a greater force.

Sensors on one side of the sensor surface 3800 are connected through their respective signal distribution trees to the mechanical actuator on the other side of the sensor surface. Thus, activated sensors on one side of the sensor surface 3800 motivate the mechanical actuator to pivot the sensor surface so the object that was detected by the sensors becomes more centered on the sensor surface.

The trees that are connected to sensors near the center of the sensor surface 3800 contain fewer leaf nodes, and are therefore connected to fewer muscle wires, than the trees connected to sensors near the edges of the sensor surface, as shown in FIG. 38. Thus, stimulated sensors near the edges of the sensor surface have more influence i.e. cause the mechanical actuators to pull with a greater force, than stimulated sensors near the center of the sensor surface. Consequently, the combination of the sensors, the signal distribution trees and the mechanical actuators tend to orient the sensor surface 3800 toward detected objects.

While the invention has been described with reference to a preferred embodiment, those skilled in the art will understand and appreciate that variations can be made while still remaining within the spirit and scope of the present invention, as described in the appended claims. For example, although embodiments were described in relation to analog delay lines, digital delay lines, shift registers and mechanical delay lines, other types of circuits, including electronic, photonics, acoustic and mechanical circuits are acceptable.

What is claimed is:

1. A signal distribution tree, comprising:
   an input;
   a plurality of delay lines, one end of each delay line being connected to the input, the other end of each delay line being connected to an end point, the end points all being disposed such that the end points define a surface; and
   a signal pickup unit connected to the signal distribution tree, the signal pickup unit comprising:
   an output; and
   a plurality of signal pickup lines, one end of each signal pickup line being connected to the output, the plurality of signal pickup lines being arranged in a geometric shape, wherein at least one of the signal pickup lines is coupled to at least one of the plurality of delay lines such that a signal can be transferred from the at least one delay line to the at least one signal pickup line.

2. The signal distribution tree of claim 1, wherein the signal pickup unit further comprises a threshold detector connected between the plurality of signal pickup lines and the output, and the threshold detector is configured to generate a signal on the output if at least a predetermined condition is met on one or more of the signal pickup lines.

3. The signal distribution tree of claim 2, wherein the predetermined condition includes receiving at least a predetermined number of signals over the one or more of the signal pickup lines.

4. The signal distribution tree of claim 2, wherein the predetermined condition includes receiving at least a predetermined aggregate amount of signal over the one or more of the signal pickup lines.

5. A signal converter for generating a second pixelated image having a second resolution from a first pixelated image having a first resolution, comprising: a first number of signal distribution trees, the first number of signal distribution trees being related to the first resolution, each signal distribution tree being connected to receive a signal from a pixel of the first pixelated image, each signal distribution tree comprising: an input; and a plurality of delay lines, one end of each delay line being connected to the input, the other end of each delay line being connected to an end point, the end points all being disposed such that the end points define a surface; a second number of signal pickup units, the second number of signal pickup units being related to the second resolution, each signal pickup unit contributing to a pixel of the second pixelated image, each signal pickup unit comprising: an output; and a plurality of signal pickup lines, one end of each signal pickup line being connected to the output, the plurality of signal pickup lines being arranged in a geometric shape, wherein at least one of the signal pickup lines is coupled to at least one of the delay lines of at least one of the signal distribution trees such that a signal can be transferred from the at least one delay line to the at least one signal pickup line.

6. The signal converter of claim 5, wherein the surface is at least part of a hemisphere and the geometric shape is at least part of a hemisphere.

7. A signal processor for detecting a point, comprising: a first plurality of first sensors in a sensor array and arranged in a first circle; a second plurality of second sensors in the sensor array and arranged in a second circle that is concentric with the first circle, sizes of the first and second circles corresponding to diameters of two Airy rings on the sensor array; a plurality of signal distribution trees arranged in an array, each signal distribution tree being coupled to a first or a second sensor, each signal distribution tree comprising: an input; and a plurality of delay lines, one end of each delay line being connected to the input, the other end of each delay line being connected to an end point, the end points all being disposed such that the end points define a surface; and at least one signal pickup unit interdigitated with at least one of the signal distribution trees, each signal pickup unit comprising; an output; and a plurality of signal pickup lines, one end of each signal pickup line being connected to the output, the plurality of signal pickup lines being arranged in a geometric shape, wherein at least one of the signal pickup lines is coupled to at least one of the delay lines of at least one of the signal distribution trees such that a signal can be transferred from the at least one delay line to the at least one signal pickup line.

8. The signal processor of claim 7, wherein each signal pickup unit further comprises a threshold detector connected between the plurality of signal pickup lines and the output, and the threshold detector is configured to generate a signal on the output if at least a predetermined condition is met on one or more of the signal pickup lines.

9. The signal distribution tree of claim 8, wherein the predetermined condition includes receiving at least a predetermined number of signals over the one or more of the signal pickup lines.

10. The signal distribution tree of claim 8, wherein the predetermined condition includes receiving at least a predetermined aggregate amount of signal over the one or more of the signal pickup lines.

11. In an optical apparatus in which first signals within a first range of wavelengths and second signals within a second range of wavelengths are refracted by different amounts, an array of sensors, comprising: a first plurality of sensors disposed along a first circle, each first sensor being sensitive to signals in the first range of wavelengths; and a second plurality of sensors disposed along a second circle, each second sensor being sensitive to signals in the second range of wavelengths; and wherein: the second circle is smaller than the first circle by an amount that corresponds to the difference in diffraction of the first and second signals in the optical apparatus; and signals from the first and second sensors are processed as though the first and second sensors were disposed along a common circle.

12. A signal processor for detecting a moving object, comprising: a plurality of ordered signal distribution lines, each signal distribution line being a delay line, each delay line being tapped at a point isochronal from the beginning of the delay line; a signal pickup line comprising a multi-tapped delay line connected to the plurality of signal distribution lines such that successive taps of the signal pickup line are coupled to the isochronal taps of the signal distribution line in order; and a threshold detector connected to an output of the signal pickup line and configured to produce a signal if at least a predetermined condition is met on the signal pickup line.

13. The signal processor of claim 12, wherein the predetermined condition includes receiving at least a predetermined number of signals over the signal pickup line.

14. The signal processor of claim 12, wherein the predetermined condition includes receiving at least a predetermined aggregate amount of signal over the signal pickup line.

* * * * *